(12) United States Patent
Aranami et al.

(10) Patent No.: US 8,207,522 B2
(45) Date of Patent: *Jun. 26, 2012

(54) COMPOSITE COMPRISING ARRAY OF NEEDLE-LIKE CRYSTAL, METHOD FOR PRODUCING THE SAME, PHOTOVOLTAIC CONVERSION ELEMENT, LIGHT EMITTING ELEMENT, AND CAPACITOR

(75) Inventors: Junji Aranami, Kyoto (JP); Susumu Yoshikawa, Ikeda (JP)

(73) Assignees: Kyocera Corporation, Kyoto (JP); Susumu Yoshikawa, Osaka (JP)

( * ) Notice: Subject to any disclaimer, the term of this patent is extended or adjusted under 35 U.S.C. 154(b) by 542 days.

This patent is subject to a terminal disclaimer.

(21) Appl. No.: 11/916,014

(22) PCT Filed: May 30, 2006

(86) PCT No.: PCT/JP2006/310758
§ 371 (c)(1),
(2), (4) Date: Nov. 4, 2009

(87) PCT Pub. No.: WO2006/129650
PCT Pub. Date: Dec. 7, 2006

(65) Prior Publication Data
US 2010/0043859 A1   Feb. 25, 2010

(30) Foreign Application Priority Data
May 31, 2005   (JP) .................................. 2005-160703

(51) Int. Cl.
*H01L 33/00* (2010.01)
(52) U.S. Cl. .................... 257/13; 257/43; 257/E33.001; 257/103; 136/252
(58) Field of Classification Search ........................ None
See application file for complete search history.

(56) References Cited

U.S. PATENT DOCUMENTS
5,066,475 A * 11/1991 Yoshinaka et al. ............ 423/622
(Continued)

FOREIGN PATENT DOCUMENTS
JP   06-252360   9/1994
(Continued)

OTHER PUBLICATIONS

Lee, Yun-Ju, Matthew T. Lloyd, Dana C. Olson, Robert K. Grubbs, Ping Lu, Robert J. Davis, James A. Voigt, and Julia W. P. Hsu. "Optimization of ZnO Nanorod Array Morphology for Hybrid Photovoltaic Devices." The Journal of Physical Chemistry C 113.35 (2009): 15778-5782.*

(Continued)

*Primary Examiner* — Thomas L Dickey
*Assistant Examiner* — Joseph Schoenholtz
(74) *Attorney, Agent, or Firm* — DLA Piper LLP (US)

(57) ABSTRACT

A composite of a base and an array of needle-like crystals formed on a surface of the base is provided, in which the base side and the opposite side to the base with respect to the array can be isolated in a satisfactory manner. A composite 10 contains a transparent electrode 2 serving as the base and an array 4 of needle-like crystals 3 formed thereon. The needle-like crystals 3 are made of, for example, zinc oxide. The array 4 includes a first region R1 on the transparent electrode 2 side and a second region R2 on the opposite side to the transparent electrode 2 with respect to the first region R1. A proportion of the cross section of the needle-like crystals 3 in a plane parallel to the surface of the transparent electrode 2 is lower in the second region R2 than in the first region R1, and the surface of the transparent electrode 2 is substantially covered with the needle-like crystals 3 in the first region R1.

22 Claims, 15 Drawing Sheets

U.S. PATENT DOCUMENTS

| | | | | |
|---|---|---|---|---|
| 5,279,809 A | * | 1/1994 | Kitano et al. | 423/622 |
| 5,804,466 A | * | 9/1998 | Arao et al. | 438/95 |
| 6,270,571 B1 | * | 8/2001 | Iwasaki et al. | 117/88 |
| 6,635,899 B2 | * | 10/2003 | Saito et al. | 257/64 |
| 6,649,824 B1 | * | 11/2003 | Den et al. | 136/256 |
| 7,087,831 B2 | * | 8/2006 | Den et al. | 136/250 |
| 8,013,321 B2 | * | 9/2011 | Aranami et al. | 257/13 |
| 2002/0037249 A1 | * | 3/2002 | Konakahara et al. | 423/592 |
| 2002/0139688 A1 | | 10/2002 | Okura et al. | 205/333 |
| 2004/0079962 A1 | | 4/2004 | Kanechika et al. | 257/163 |
| 2005/0009224 A1 | | 1/2005 | Yang et al. | 438/57 |
| 2005/0081912 A1 | | 4/2005 | Okura et al. | 136/265 |
| 2007/0166531 A1 | * | 7/2007 | Ohnishi et al. | 428/323 |

FOREIGN PATENT DOCUMENTS

| | | | |
|---|---|---|---|
| JP | 11-345991 | | 12/1999 |
| JP | 2000-223167 | | 8/2000 |
| JP | 2001-068649 | | 3/2001 |
| JP | 2002-025634 | | 1/2002 |
| JP | 2002-252359 | | 9/2002 |
| JP | 2002-293540 | | 10/2002 |
| JP | 2002-356400 | | 12/2002 |
| JP | 2003-151648 | | 5/2003 |
| JP | 2003-243053 | | 8/2003 |
| JP | 2003-321299 | | 11/2003 |
| JP | 2004060017 A | * | 2/2004 |
| WO | 2004050547 A2 | | 6/2004 |

OTHER PUBLICATIONS

Olson, D., J. Piris, R. Collins, S. Shaheen, and D. Ginley. "Hybrid Photovoltaic Devices of Polymer and ZnO Nanofiber Composites." Thin Solid Films 496.1 (2006): 26-29.*

Beek, W. J. E., M. M. Wienk, and R. A. J. Janssen. "Efficient Hybrid Solar Cells from Zinc Oxide Nanoparticles and a Conjugated Polymer." Advanced Materials 16.12 (2004): 1009-013.*

Coakley, Kevin M. "Infiltraging Semiconducting Polymers into Self-Assembled Mesoporous Titania Filsm for Photovoltaic Applications." Advanced Functional Materials 4th ser. 14 (2003): 301-06.*

R. Könenkamp et al. "Ultraviolet Electroluminescence from ZnO Polymer Heterojunction Light-emitting Diodes" Nano Letters, Sep. 2005, vol. 5, No. 10, pp. 2005-2008.

"Hyoumen Kagaku no Kiso to Ouyou" (with English translation) Edited by the Surface Science Society of Japan, pp. 1106-1108.

A. Fujishima et al. "Electrochemical Photolysis of Water at a Semiconductor Electrode" Nature, Jul. 1972, vol. 238, pp. 37-38.

European search report for corresponding European application 06746986.6.

Renee B. Peterson et al., "Epitaxial Chemical Deposition of ZnO Nanocolumns from NaOH Solutions", Langmuir, 2004, vol. 20, No. 12, pp. 5114-5118.

Satoshi Yamabai, et al., "Growth Conditions for Wurtzite Zinc Oxide Films in Aqueous Solutions", Journal of Material Chemistry, 2002, vol. 12, No. 12, pp. 3773-3778.

Michael H. Huang et al., "Room-Temperature Ultraviolet Nanowire Nanolaser", Science, vol. 292, Jun. 8, 2001, pp. 1897-1899.

Masanobu Izaki et al., "Transparent Zinc Oxide . Ims Prepared by Electrochemical Reaction", Appl. Phys., Lett. 68 (17), Apr. 22, 1996, pp. 2439-2440.

S. Karuppuchamy et al., "Cathodic Electrodeposition of Oxide Semiconductor Thin Films and Their Application to Dye-Sensitized Solar Cells", Solid State Ionics 151, 2002, pp. 19-27.

Yukimi Jyoko et al., "Preparation of Giant Magnetoresistance Co/Cu Multilayers by Electrodeposition", J. Electrochem. Soc. vol. 144, No. 1, Jan. 1997, L5.

Masanobu Izaki et al., "Transparent Zinc Oxide Films Chemically Prepared From Aqueous Solution", J. Electrochem. Soc. vol. 144, No. 1, Jan. 1997, L3-L4.

Masanobu Izaki et al., "Low-Temperature Electrodeposition of Room-Temperature Ultraviolet-Light-Emitting Zinc Oxide", Advanced Materials, 2003, vol. 15, No. 23, Dec. 3, pp. 2000-2002.

Wuyou Fu et al., "Anatase $TiO_2$ Nanolayer Coating on Cobalt Ferrite Nanoparticles for Magnetic Photocatalyst", Materials Letters 59 (2005) pp. 3530-3534.

* cited by examiner

ANGLE OF GRADIENT FROM 0001 PLANE [ DEGREES ]
FIRST REGION SIDE

ANGLE OF GRADIENT FROM 0001 PLANE [ DEGREES ]
SECOND REGION SIDE

COMPOSITE COMPRISING ARRAY OF NEEDLE-LIKE CRYSTAL, METHOD FOR PRODUCING THE SAME, PHOTOVOLTAIC CONVERSION ELEMENT, LIGHT EMITTING ELEMENT, AND CAPACITOR

CROSS-REFERENCE TO THE RELATED APPLICATIONS

This application is a national stage of international application No. PCT/JP2006/310758 filed May 30, 2006, which also claims benefit of priority under 35 U.S.C. §119 to Japanese Patent Application No. 2005-160703 filed May 31, 2005, the entire contents of which are incorporated by reference.

TECHNICAL FIELD

The present invention relates to a composite comprising an array of needle-like crystals, a method for producing the same, and a photovoltaic conversion element, a light emitting element, and a capacitor using the composite.

BACKGROUND ART

A photovoltaic conversion element, a light emitting element, a capacitor, and the like are elements employing a phenomenon taking place when two kinds of materials are brought into contact with each other or disposed in close proximity to each other. For example, the photovoltaic conversion element and the light emitting element employ a phenomenon taking place on the contact interface between a p-type semiconductor and an n-type semiconductor that light is generated by generation of electron-hole pairs or recombination of electrons and holes according to an amount of received light. The capacitor employs polarization of a dielectric material sandwiched between a pair of electrodes.

It is possible for these elements to enhance the properties of the elements by increasing the contact area or the opposing area of two kinds of materials. For example, by increasing the area of the interface between the p-type semiconductor and the n-type semiconductor, an amount of electron-hole pairs to be generated, that is, the magnitude of a photoelectric current (photoelectromotive force) can be increased in the photovoltaic conversion element, and an amount of light to be generated can be increased in the light emitting element. Also, by increasing the contact (opposing) area of the dielectric material and the electrodes, the electrostatic capacity can be increased in the capacitor.

In order to increase the contact area or the opposing area of two kinds of materials, an attempt is being made by using an aggregate of needle-like crystals having a large surface area (specific surface area) for these elements.

For example, Patent Document 1 specified below discloses a photovoltaic conversion element including a transparent electrode, needle-like crystals forming one charge transporting layers and formed on the transparent electrode, and the other charge transporting layer provided to come into contact with (to oppose) the needle-like crystals.

Also, Patent Document 2 specified below discloses a capacitor including a flat storage node made of polycrystalline silicon, plural needle-like crystals made of a material having the conducting property, such as germanium, and formed on the storage node, and an insulating film (dielectric material) for capacitor made of silicon oxide and provided to cover the surface of the needle-like crystals.

Patent Document 3 specified below discloses a method for producing an array of needle-like crystals by heating a substrate (base) in a solution containing amine, such as hexamethylene tetramine, as well as polyethyleneimine and zinc ions, and a device using the array of needle-like crystals produced by this producing method. As such a device, a dye sensitizing photovoltaic cell (a dye sensitizing photovoltaic cell using the array of needle-like crystals as a semiconductor having the p-type physical property) and a light emitting diode are disclosed therein. Patent Document 3 specified below further discloses a current versus voltage characteristic of an FET (Field Effect Transistor) using an array of zinc oxide needle-like crystals.

According to the producing method of Patent Document 3 specified below, it is impossible to cover the base with the array densely (substantially completely) in a region on the base side. Accordingly, as means for preventing current leakage from a portion of the base exposed through the array, an electronic block layer (insulator) is provided in clearances among needle-like crystals forming the array when the device is fabricated.

Also, Non-Patent Document 3 specified below discloses a method for producing a light emitting diode using an array of zinc oxide needle-like crystals and the properties thereof. An array of zinc oxide needle-like crystals is formed by means of electro-deposition. However, because it is impossible to cover the base with the array densely (substantially completely) in a region on the base side, an insulator is provided in clearances among needle-like crystals to prevent current leakage.

In Patent Document 3 and Non-Patent Document 3 specified below, insulating polymer, such as polymethyl methacrylate and polystyrene or the like, is used as an insulator to prevent the generation of a leak current. The insulator in each is formed to cover the zinc oxide needle-like crystals first, and thence a portion present at the tip ends of zinc oxide needle-like crystals is removed by means of UV irradiation, plasma irradiation, or the like, so that the insulator is left in clearances among the zinc oxide needle-like crystals.

Non-Patent Document 4 discloses a method for producing an array of zinc oxide needle-like crystals on a foundation layer made of zinc oxide by means of electroless plating. According to this method, a layer used as the foundation layer is obtained by applying a 2-methoxymethanol solution, in which zinc acetate dihydrate and monoethanolamine are dissolved, on the base followed by drying at 60° C. for 24 hours. The thickness of the foundation layer is in the order of 100 nm. In a case where the concentration of zinc in the plating solution is 0.01 mol/l, an array of zinc oxide needle-like crystals is obtained by regulating a pH of the plating solution during plating to 9 to 13.

Non-Patent Document 5 specified below discloses a method in which a zinc oxide thin film is formed on a glass substrate by means of sputtering and an array of zinc oxide needle-like crystals is formed using this zinc oxide thin film as the seeds. It is said that this method makes it possible to obtain needle-like crystals aligned in orientation in comparison with needle-like crystals obtained by general liquid phase growth.

Patent Document 1: Japanese Unexamined Patent Publication No. 2002-356400
Patent Document 2: Japanese Unexamined Patent Publication No. 6-252360
Patent Document 3: US-2005-0009224-A1
Non-Patent Document 1: Michael H. Huang and eight others, "Room-Temperature Ultraviolet Nanowire Nanolasers", *SCIENCE* vol. 292 p. 1897-1899 (8 Jun., 2001)

Non-Patent Document 2: Masanobu Izaki and one other, "Transparent zinc oxide films prepared by electrochemical reaction", *Appl. Phys. Lett.* 68(17), (22 Apr., 1996)

Non-Patent Document 3: R. Konenkamp and two others, "Ultraviolet Electroluminescence from ZnO/Polymer Heterojunction Light-Emitting Diodes", *Nano Letters*, vol. 5 p. 2005 (17 Sep., 2005)

Non-Patent Document 4: Satoshi Yamabi and one other, "Growth conditions for wurtzite zinc oxide films in aqueous solutions", *J. Mater. Chem.*, 12, 3773, (2002)

Non-Patent Document 5: R. B. Peterson and two others, "Epitaxial Chemical Deposition of ZnO Nanocolumns from NaOH Solutions", *Langmuir*, 20, 5114, (2004)

Non-Patent Document 6: edited by the Surface Science Society of Japan, *Kaitei-ban, Hyoumen Kagaku no Kiso to Ouyou*, NTS Inc.

Non-Patent Document 7: A. Fujishima and one other, "Electrochemical Photolysis of Water at a Semiconductor Electrode" *Nature*, 238, 37 (1972)

DISCLOSURE OF THE INVENTION

Problems to be Solved by the Invention

In the photovoltaic conversion element of Patent Document 1 supra, however, each needle-like crystal extends almost perpendicularly to the surface of the transparent electrode (base) and adjacent needle-like crystals are disposed spaced apart from each other. Hence, the transparent electrode is not completely covered with an array of needle-like crystals and a portion of the transparent electrode exposed through the array of needle-like crystals is in contact with the other charge transporting layer. This causes a leak current to flow between the transparent electrode and the other charge transporting layer, and efficiency as a photovoltaic conversion element is deteriorated.

The structure of this photovoltaic conversion element using needle-like crystals may be applied to a light emitting element. In such a light emitting element, however, a leak current flows between the transparent electrode and the other charge transporting layer as in the case of the photovoltaic conversion element, and efficiency of the light emitting element is deteriorated.

In the capacitor of Patent Document 2 supra, too, because each needle-like crystal extends almost perpendicularly to the surface of the storage node and adjacent needle-like crystals are disposed spaced apart from each other, the storage node is not completely covered with an array of needle-like crystals and a portion of the storage node exposed through the array of needle-like crystals is in contact with the insulating film for capacitor. In short, the insulating film for capacitor is in contact with both the storage node and the needle-like crystals, which are materials having different electric physical properties.

This makes it impossible to apply a voltage homogeneously across the insulating film for capacitor, and a loss of the electrostatic capacity occurs in this capacitor. In addition, because an electric double layer is formed at the interface between the storage node and the needle-like crystals while a voltage is applied to the insulating film for capacitor, a loss of potential occurs, which gives rise to a loss of the charge storage.

The structure of this capacitor using needle-like crystals may be applied to an electric double layer capacitor. In this case, an electrolytic solution is used instead of the insulating film for capacitor, and as needle-like crystals, those functioning as a polarizable electrode can be used. In this case, however, the electrolytic solution and the base corresponding to the storage node come into direct contact with each other, too. Because the electrolytic solution contains a supporting salt to reduce internal resistance, the contact between the base and the electrolytic solution gives rise to a leak current.

Also, in the devices disclosed in Patent Document 3 supra and Non-Patent Document 3 supra, the insulator for preventing leakage may cause an inconvenience as it gets colored due to deterioration by the use over a long period and deterioration by heat and light, or may cause an inconvenience in properties (for example, electric resistance) due to diffusion of impurities into the device ascribed to the use of the insulator. Further, the largeness of the effective surface area is the advantage of using an array of needle-like crystals. Nevertheless, the effective surface area is reduced by providing insulating polymer in clearances of the array of needle-like crystals.

In addition, according to the producing method of Non-Patent Document 4 supra, the presence of a pin hole in the foundation layer makes it impossible to cover the base exposed from beneath the foundation layer via this pin hole with an array of needle-like crystals. The foundation layer therefore has to be made thicker so that a pin hole will not be formed in the foundation layer. Making the foundation layer thicker, however, readily gives rise to an inconvenience that the array of needle-like crystals separates from the base and a part of the base is exposed.

According to the producing method of Non-Patent Document 5 supra, because the needle-like crystals obtained are those extending in a perpendicular direction to the base in an aligned fashion (a range of the angle produced with the base is small), when an attempt is made to increase the effective surface area of needle-like crystals by securing clearances among needle-like crystals, a problem arises that the base is exposed. Needle-like crystals extend in a perpendicular direction to the base in an aligned fashion because the zinc oxide thin film formed by means of sputtering and forming the foundation layer is an orientation film and the crystal orientations in a portion of the foundation layer that becomes the staring points for growth of needle-like crystals have been already aligned.

Such being the case, an object of the invention is to provide a composite of a base and an array of needle-like crystals formed on the surface of the base, in which the base side and the opposite side to the base with respect to the array can be isolated in a satisfactory manner and a method for producing the same.

Another object of the invention is to provide a composite in which the base side and the opposite side to the base with respect to the array can be isolated in a satisfactory manner without using an insulator and a method for producing the same.

A further object of the invention is to provide a method for producing a composite in which an array of needle-like crystals hardly separates from the base.

Still another object of the invention is to provide highly efficient photovoltaic conversion element and light emitting element.

Still another object of the invention is to provide a capacitor capable of enhancing the electrostatic capacity.

Still another object of the invention is to provide a capacitor capable of reducing a leak current.

Means for Solving the Problems

A composite according to a first aspect of the present invention comprises a base and an array of a plurality of needle-like crystals made of oxide and formed on a surface of the base, wherein the array includes a first region on a side of the base and a second region on an opposite side to the base with respect to the first region, wherein a proportion of a cross section of the needle-like crystals in a plane parallel to the surface of the base is lower in the second region than in the first region and the surface of the base is substantially covered with the needle-like crystals in the first region.

A composite according to a second aspect of the present invention comprises a base and an array of a plurality of needle-like crystals made of oxide and formed on a surface of the base, wherein the array includes a first region on a side of the base and a second region on an opposite side to the base with respect to the first region, wherein an orientation degree of the needle-like crystals in the first region is low in comparison with the second region and the surface of the base is substantially covered with the needle-like crystals in the first region.

In these composites, the surface of the base is substantially completely covered with the needle-like crystals in the first region. In other words, the entire surface of the base is covered with the needle-like crystals. It is therefore possible in this composite to isolate the base side and the opposite side to the base with respect to the array of needle-like crystals in a satisfactory manner.

In the composite according to the first aspect, for example, a proportion of the cross section (area) of the needle-like crystals in a plane parallel to the surface of the base may become lower in the second region than in the first region because the number of needle-like crystals per unit volume is smaller in the second region than in the first region.

In the composite according to the second aspect, because the needle-like crystals in the first region are allowed to extend in various directions, they are able to cover the surface of the base efficiently. It is possible to confirm that the orientation degree of the needle-like crystals in the first region is lower than the orientation degree of the needle-like crystals in the second region, for example, by separating the array from the base and performing the X-ray diffraction analysis of the array on the side (first region) where the base was present and on the opposite side (second region). For example, in one measurement example, the X-ray diffraction pattern of the second region shows the (002) plane peak and the (100) plane peak alone, whereas the X-ray diffraction pattern of the first region shows the (101) plane peak in addition to these peaks.

In a case where the composite includes a large number of plural external needle-like crystals (described more in detail below) extending from the end portions of the needle-like crystals on the opposite side to the base to the outside of the array region of the needle-like crystals, there may be a case where it is impossible to confirm a difference of the orientation degree between the first region and the second region by the X-ray diffraction analysis. However, even in such a case, an observation of an EBSP (Electron Back Scatter Pattern) makes it possible to confirm that the orientation degree of needle-like crystals is low in the first region in comparison with the second region. This is because, in contrast to the X-ray diffraction by which an average of all the regions in the measured plane of the array subjected to measurement is obtained as information about the orientation degree of needle-like crystals, information (plane orientation) for each region within the measured plane can be obtained from the EBSP.

It should be noted, however, that in a case where the second region side of the array is covered with the external needle-like crystals almost entirely (for example, in a case where the external needle-like crystals alone are confirmed when the second region side of the array of needle-like crystals is observed using a scanning electron microscope), it is impossible to confirm a difference of the orientation degree of the needle-like crystals between the first region and the second region of the array by the EBSP.

In such a case, a measurement sample may be polished from the side of the external needle-like crystals by means of mechanical polishing, chemical mechanical polishing, and the like until the array (second region) of the needle-like crystals is exposed, and the first region side and the second region side of this array are observed by the EBSP. Accordingly, it becomes possible to confirm the orientation degree of the needle-like crystals on each of the first region side and the second region side of the array. In this case, it is preferable to fill clearances of the array of needle-like crystals with resin or the like before the measurement sample is polished.

A composite according to a third aspect of the present invention comprises a base and an array of a plurality of needle-like crystals made of oxide and formed on a surface of the base, wherein the needle-like crystals include first needle-like crystals extending from respective plural starting points positioned spaced apart from one another on the surface of the base in a direction producing an angle with the surface of the base such that falls within a specific angular range, and second needle-like crystals extending from the respective starting points in a direction within a wider angular range encompassing the specific angular range and shorter than the first needle-like crystals, wherein a portion on the surface of the base exposed through the first needle-like crystals is substantially covered with the second needle-like crystals.

In this composite, a portion on the surface of the base exposed through the first needle-like crystals is substantially (completely) covered with the second needle-like crystals. In other words, the surface of the base is substantially completely covered with the needle-like crystals (first and second needle-like crystals). It is thus possible in the composite to isolate the base side and the opposite side to the base with respect to the array of needle-like crystals in a satisfactory manner.

In any of the composites according to the first through third aspects of the invention, because the base side and the opposite side to the base are isolated in a satisfactory manner virtually by the needle-like crystals alone, there is no need to cover the base with an insulator auxiliary for this isolation. In short, in the composites of the invention, the base side and the opposite side to the base with respect to the array can be isolated in a satisfactory manner without using an insulator.

Because the need to provide an insulator in a space among the needle-like crystals is eliminated, it is possible to increase the effective surface area of the needle-like crystals.

In addition, because there is no need for these composites to use an insulator for isolating the base side and the opposite side to the base with respect to the array in a satisfactory manner, in a device using these composites, neither an inconvenience resulting from deterioration or coloring of the insulator nor diffusion of impurities into the device ascribed to the use of the insulator will occur.

The array referred to herein is defined as an aggregate of needle-like crystals for which the frequency of angles produced between the surface of the base and the respective needle-like crystals becomes higher at a particular angle (for example, 90°). The specific angular range (a distribution range of the angle produced between the surface of the base and the longitudinal direction of the first needle-like crystals) is, for example, 45° to 90°. A distribution range of the angle produced between the surface of the base and the longitudinal direction of the second needle-like crystals may be, for example, 0° (parallel to the surface of the base) to 90° (perpendicular to the surface of the base).

The needle-like crystals referred to herein mean so-called whiskers having an aspect ratio of crystals of, for example, 5 or higher. The aspect ratio of the needle-like crystals is preferably 10 or higher, and more preferably, 100 or higher. Also, the minimal length passing the center of gravity in the traverse cross section (cross section perpendicular to the longitudinal direction) of the needle-like crystals is preferably 500 nm or smaller, more preferably, 100 nm or smaller, and further preferably, 50 nm or smaller.

With the composite as above, the needle-like crystals can be used as an electrode in batteries (a device that chemically stores energy, such as a lithium-ion battery and a fuel cell) and an electron source in an electron emitting device. When used as the foregoing, it is preferable that the needle-like crystals have a higher aspect ratio (for example, preferably 10 or higher).

The needle-like crystals include defect-free acicular single crystals and those having screw dislocation, and they may have polycrystals or an amorphous portion. The outer shape of the needle-like crystals includes but not limited to a circular column, a circular cone, and a hexagonal column, or a circular cone with a flat tip end (truncated cone) and a circular column with a pointed tip end or a flat tip end. Further, the outer shape of the needle-like crystals includes but not limited to a triangular pyramid, a square pyramid, a hexagonal pyramid, a polygonal pyramid other than the foregoing, and a polygonal pyramid with a flat tip end, and a triangular column, a square column, a hexagonal column, and a polygonal column other than the foregoing, or a triangular column, a square column, a hexagonal column, and a polygonal column other than the foregoing with a pointed tip end or a flat tip end. The outer shape may further include a bent form of the foregoing.

The oxide may be a compound made of at least one kind of element among Zn, Ti, Zr, Hf, Ni, Fe, Co, Na, K, Li, Mg, Ca, Sr, Ba, Si, Al, Ga, In, V, Nb, Ta, W, Mo, Cr, and Sn and oxygen, or it may include at least one kind of element among B, C, N, S, P, F, and Cl as a dopant or an element that substitutes for oxygen in part.

The base referred to herein is a substance that holds the needle-like crystals (array) at least after the needle-like crystals are grown. The surface of the base may be a flat surface, a concavo-convex surface, a spherical surface, and so forth. A constituting material, a thickness, a shape, and an optical property of the base can be designed as needed to suit the required durability and the design. For example, a glass substrate, a glass substrate on which a transparent conductive film is applied, plastic, paper given with the water resistance, ceramic, a metal plate, a shaped metal plate, and so forth can be used as needed.

The specific direction and the c-axis of the needle-like crystals may coincide with each other, and in this case, the longitudinal direction of the needle-like crystals may be oriented in the specific direction. In this case, the c-axes of the needle-like crystals are oriented with respect to the specific direction.

In this case, when the crystal system of the needle-like crystals is, for example, the hexagonal system, the optical property in the in-plane direction perpendicular to the specific direction is homogeneous at least in the second region. This eliminates a variance of the optical property resulting from the crystal orientation, such as a degree of double refraction, and for example, when this composite is applied to a light emitting element, it becomes possible to extract homogeneous light. In addition, in this case, the electric property also becomes homogeneous in the second region in the in-plane direction perpendicular to the specific direction. Hence, when this composite is applied to a light emitting element, it is possible to reduce irregularities of light emission and when this composite is applied to a photovoltaic conversion element, it is possible to stabilize the conversion efficiency.

The composite may further comprise a plurality of external needle-like crystals extending from end portions of the needle-like crystals on an opposite side to the base to an outside of an array region of the needle-like crystals.

For example, in a case where this composite is used for a photovoltaic conversion element while the base is a transparent electrode and the needle-like crystals are a part of a p-n junction body, it is possible to achieve photovoltaic conversion by allowing light to go incident on the p-n junction portion from the base side. In this case, the photovoltaic conversion efficiency can be increased by reflecting (scatting) light having passed through the array region of the needle-like crystals once by the external needle-like crystals and introducing the light to the p-n junction portion.

The plurality of external needle-like crystals may extend in random directions within an angular range within which no interference with the array occurs. More specifically, the external needle-like crystals may be grown in plural axial directions in the outside of the array region of the needle-like crystals. In this case, for example, it is possible to reflect light having passed through the array region of needle-like crystals efficiently toward the p-n junction portion by the external needle-like crystals in the application example of the photoelectric element described above. In addition, by providing the external needle-like crystals, it is possible to increase the specific surface area of the composite.

The needle-like crystals may be made of zinc oxide.

A plurality of microscopic regions having random crystal orientations may be present in a vicinity of an interface between the array and the base.

When needle-like crystals are grown, needle-like crystals may be grown from particles that function as seeds. In this case, at least a part of the particles that function as the seeds may possibly remain as the microscopic regions after the growth of needle-like crystals completes. The adhesion between the needle-like crystals and the base can be enhanced by the microscopic regions. The microscopic regions may be made of the same material as the needle-like crystals or they man by made of a different material. Alternatively, the microscopic regions may be made of a fluorescent substance or a conductive material having a suitable electric conductivity. In a case where these materials are used, it is possible to confer a suitable optical or electric property to the composite.

A photovoltaic conversion element according to the present invention includes the composite described above. The array in the composite is of one conduction type, and the photovoltaic conversion element further includes a semiconductor portion of an opposite conduction type opposing a surface of the needle-like crystals.

One conduction type and the opposite conduction type mean one and the other one of the p-type and the n-type, respectively. This photovoltaic conversion element is able to perform photovoltaic conversion by the p-n junction of the array of the one conduction type and the semiconductor portion of the opposite conduction type. Because the surface of the base is substantially completely covered with the array (first and second needle-like crystals), the semiconductor portion of the opposite conduction type and the base are isolated in a satisfactory manner, which in turn reduces the contact area therebetween. It is thus possible to reduce a leak current between the semiconductor portion of the opposite conduction type and the base. The conversion efficiency can be therefore increased.

The semiconductor portion of the opposite conduction type is a portion where it has virtually the opposite conduction type for the array of the one conduction type, and it may be a conductive material that forms the Schottky junction with the semiconductor portion of the one conduction type. In this case, for one of the p-type and the n-type, which is the conduction type (the one conduction type) of the semiconductor portion, the conductive material is able to conduct a current as the other conduction type.

The photovoltaic conversion element includes but not limited to an organic EL element, a photovoltaic cell (solar battery), and a photodetector. The base may be a metal electrode or it may be made of a semiconductor of the one conduction type (the same conduction type as the array).

This photovoltaic conversion element may be a so-called dye sensitizing photovoltaic conversion element (photovoltaic cell), in which a dye serving as a light absorption layer is provided between the array of the one conduction type and the semiconductor portion of the opposite conduction type (in the vicinity of the interface).

The photovoltaic conversion element that may contain a photocatalyst converts light energy to electric energy and that accelerates a chemical reaction using the electric energy.

By using electric energy stored by light excitation for a chemical reaction taking place on the surface of the photocatalyst, the photocatalyst is able to accelerate decomposition of, for example, organic matter, water or the like. A photocatalytic reaction is classified into a photoelectrochemical reaction. As an application example of the photovoltaic conversion element, there is an element (device) that gives rise to a photocatalytic reaction (see Non-Patent Document 7 supra).

The array of needle-like crystals of the invention may be made of a photocatalyst (may contain a photocatalyst). In this case, the array can be used as a photocatalytic electrode. Because the array of needle-like crystals of the invention has a large surface area, a reaction efficiency of the needle-like crystals (array) made of (containing) a photocatalyst is high.

In a case where the array of needle-like crystals of the invention is used as a photocatalytic electrode, the array accelerates a chemical reaction (for example, an oxidative reaction) via one of electrons and holes for the other one of electrons and holes to be transported from the base, which can in turn accelerate a different reaction (for example, a reductive reaction) in another system. Another system referred to herein may be, for example, a system including a counter electrode (for example, a counter electrode made of platinum) electrically connected to the base.

Conventionally, a photocatalyst in the form of fine particles is used to increase the area of the surface of the photocatalyst, which is a reaction field. The photocatalyst in the form of fine particles is dispersed in a system and irradiated by light. When configured in this manner, it is possible to increase the effective surface area. It should be noted, however, that because electrons and holes that respectively accelerate different reactions are present within the same photocatalyst, recombination of electrons and holes is readily accelerated. Also, in this system, a contact among the photocatalyst can occur and recombination of electrons and holes is readily accelerated also by such a contact.

In the composite of the invention, because the plurality of needle-like crystals can be brought into an electrically connected state, it is possible to give rise to reactions via one and the other of electrons and holes, respectively, in a system including the array and another system as described above. In other words, because chemical reactions can be accelerated while reaction fields of electrons and holes are separated, recombination of electrons and holes hardly takes place. In addition, because the needle-like crystals substantially cover the base, a probability is low for electrons or holes transported to the base to recombine with holes or electrons.

Conventionally, a photocatalyst made of a semiconductor and in the form of a flat plate is used as the electrode in some cases. Even for such a photocatalyst forming an electrode in the form of a flat plate, it is possible to reduce a probability of the recombination of electrons and holes. The reaction efficiency, however, is low, because the effective surface area cannot be increased due to the electrode shape.

In the invention of the present application, in a case where the array contains a photocatalyst, not only is it possible to increase the reaction efficiency by increasing the effective surface area, but it is also possible to reduce the recombination of electrons and holes.

When used as a photocatalyst, it is possible to adjust an absorption end wavelength by subjecting the array to doping or substituting oxygen in the array with nitrogen or the like in part. For example, by doping gallium into a part of the array of zinc oxide followed by calcination in an ammonia atmosphere, it is possible to nitride doped gallium (substitute oxygen in the array of zinc oxide with nitrogen). It has been revealed that such a material is capable of decomposing water using light energy in a visible light region.

A light emitting element according to the present invention includes the composite descried above. The array in the composite is of one conduction type, and the light emitting element further includes a semiconductor portion of an opposite conduction type opposing a surface of the needle-like crystals.

The light emitting element includes but not limited to a semiconductor light emitting element (photodiode) and a semiconductor laser. The base may be a metal electrode or it may be made of a semiconductor of the one conduction type (the same conduction type as the array).

By applying a suitable voltage to the p-n junction portion of the array of the one conduction type and the semiconductor portion of the opposite conduction type, the light emitting element is able to generate light by recombination of electrons and holes. Because the surface of the base is substantially completely covered with the array, the semiconductor portion of the opposite conduction type and the base are isolated in a satisfactory manner, which in turn reduces the contact area therebetween. It is thus possible to reduce a leak current between the semiconductor portion of the opposite conduction type and the base. The light emitting efficiency can be therefore increased.

In the photovoltaic conversion element and the light emitting element of the invention, the array of the one conduction type and the semiconductor portion of the opposite conduction type may function as a light receiving material (in the case of the photovoltaic conversion element) and a light emitting material (in the case of the light emitting element) The photovoltaic conversion element and the light emitting element of the invention may include a non-doped light receiving or light emitting material or a light receiving or light emitting material doped for the purpose of changing the optical property, for example, between the array of the one conduction type and the semiconductor portion of the opposite conduction type.

The light receiving or light emitting material referred to herein means a material that converts light to electricity or a material that converts electricity to light by utilizing a band gap, and an organic dye, a pigment, a fluorescent substance, and a semiconductor are used for the material. As long as the photoelectric converting or light emitting function is exerted, the morphology as to whether it is a crystalline, amorphous, or monomolecular material or an aggregate is not particularly specified.

A capacitor according to still another aspect of the present invention includes the composite described above. The array in the composite functions as a first electrode, and the capacitor further includes a second electrode opposing the first electrode and a dielectric material interposed between the first electrode and the second electrode.

The capacitor referred to herein means a device that physically stores charges.

Because the surface of the base is substantially completely covered with the array, the dielectric material and the base are isolated in a satisfactory manner, which in turn reduces the contact area therebetween. More specifically, the dielectric material is in contact with virtually the first electrode (array) alone on the opposite side to the second electrode. Hence, in a case where the needle-like crystals are made of a single kind of material (oxide), it is possible to apply a voltage to the dielectric material homogeneously. In addition, an electric double layer will not be formed between the base and the array. The capacitor is thus able to enhance the electrostatic capacity.

A capacitor according to still another aspect of the present invention includes the composite described above. The array in the composite functions as a first polarizable electrode, and the capacitor further includes a second polarizable electrode opposing the first polarizable electrode and an electrolytic solution interposed between the first polarizable electrode and the second polarizable electrode.

This capacitor may be a so-called electric double layer capacitor in which an electric double layer is formed in the vicinity of the interfaces between the respective first and second polarizable electrodes and the electrolytic solution. Because the surface of the base is substantially completely covered with the array, the electrolytic solution and the base are isolated in a satisfactory manner, which in turn reduces the contact area therebetween. Hence, even in a case where the base forms a part of the electrode, it is possible to reduce a leak current after the capacitor is fully charged, which can in turn avoid wasteful power consumption.

In an electric double layer capacitor configured to respond to quick charging, the electrolytic solution contains the electrolyte excessively and the electrolyte is present in the electrolytic solution even in a fully charged state. When the electrolytic solution is in contact with the base serving as one of the electrodes, power is consumed wastefully as a current (leak current) flows between the both electrodes via the electrolyte remaining after the capacitor is fully charged. On the contrary, in a case where the electrolytic solution is not in contact with the base (electrode) as in the capacitor of the present invention, it is possible to suppress such a current. It goes without saying that it is possible to suppress inverse electron migration, which is wasteful power consumption, even in a state where no voltage is applied (during discharging) after the capacitor is charged.

The electrolytic solution (battery electrolyte) may be either a solution based on a non-aqueous solvent or an aqueous solution. The electrolytic solution based on a non-aqueous solvent is made by dissolving an electrolyte in an organic solvent, and examples of an available organic solvent include but not limited to ethylene carbonate, propylene carbonate, 1-butylene carbonate, sulfolane, γ-butyrolactone, dimethylsulfoxide, dimethylformamide, acetonitrile, tetrahydrofuran, and dimethoxyethane. A mixture of two or more kinds of the foregoing can be used as well.

An available electrolyte for the electrolytic solution based on a non-aqueous solvent includes but not limited to $(C_2H_5)_4PBF_4$, $(C_3H_7)_4PBF_4$, $(C_2H_5)_4NBF_4$, $(C_3H_7)_4NBF_4$, $(C_2H_5)_4PPF_6$, $(C_2H_5)_4PCF_3SO_3$, $LiBF_4$, $LiC_{1-4}$, $LiCF_3$, and $SO_3$. An available electrolyte for the aqueous electrolytic solution includes but not limited to NaCl, NaOH, HCl, $H_2SO_4$, and $Li_2SO_4$. A polymer electrolytic solution made by adding a high-molecular substance to the foregoing can be used as well.

A method for producing the composite according to still another aspect of the invention includes a step of forming the needle-like crystals on a foundation made of a plurality of crystal grains that are crystal grains having random crystal orientations by means of electroless plating using a plating solution containing at least one kind of alkali selected from the group consisting of $X^1OH$, where $X^1$ is one of Na, K, and Cs, $X^2{}_2CO_3$, where $X^2$ is one of H, Na, K, and Cs, and $NH_3$ and having a pH of 13 or higher.

A method for producing the composite according to still another aspect of the present invention includes a step of forming the needle-like crystals on a foundation having a hydrophilic surface and being amorphous by means of electroless plating using a plating solution containing at least one kind of alkali selected from the group consisting of $X^1OH$, where $X^1$ is one of Na, K, and Cs, $X^2{}_2CO_3$, where $X^2$ is one of H, Na, K, and Cs, and $NH_3$ and having a pH of 13 or higher.

The needle-like crystals may be formed on a foundation made of resin having a hydrophilic surface by means of electroless plating using a plating solution containing at least one kind of alkali selected from the group consisting of $X^1OH$, where $X^1$ is one of Na, K, and Cs, $X^2{}_2CO_3$, where $X^2$ is one of H, Na, K, and Cs, and $NH_3$ and having a pH of 13 or higher.

By allowing the alkali specified above to ionize or by ionizing the alkali in a plating solution at room temperature, it is possible to obtain a plating solution in which hydroxide ions are present.

It is possible to produce the composite described above by the producing methods of the invention of the present application. In other words, according to the producing method, not only is it possible to form a plurality of needle-like crystals that are grown from the starting points on the foundation at various angles with respect to the surface of the base, but it is also possible to make the starting points for growth on the foundation denser. Also, according to the producing method, it is possible to let a large number of needle-like crystals be grown from a single starting point.

On the contrary, in a case where an alkali specified as above as an alkali in the plating solution is not used, and/or in a case where a plating solution having a pH smaller than 13 is used, a manner in which the needle-like crystals are grown differs significantly. Because the starting points for growth on the foundation become rougher or the directions of growth are aligned, it becomes impossible to cover the base substantially completely with the needle-like crystals (array).

Also, in a case where a foundation that satisfies the specific requirements specified above is not used, for example, in a case where a crystalline foundation that is a foundation whose crystal orientations are aligned in the respective portions thereof is used, the directions of growth of needle-like crystals are aligned, which also makes it impossible to cover the base with the needle-like crystals (array) substantially completely.

Of the needle-like crystals, those extend in a direction producing an angle with the surface of the base such that falls within a specific angular range (for example, those producing an angle closer to the right angles with the surface of the base) are grown long and become the first needle-like crystals. Meanwhile, of the needle-like crystals, those producing an angle with the surface of the base such that falls outside the specific angular range (for example, those producing an angle far from the right angles with the surface of the base) and a part of those within the specific angular range cannot be grown long as they are hindered by needle-like crystals grown from another adjacent starting point, and they become the second needle-like crystals that cover a portion on the surface of the base exposed through the first needle-like crystals substantially completely.

With the use of the plating solution specified as above, needle-like crystals can be grown using a substance having a hydroxyl group on the surface thereof as a catalyst. A substance having a hydroxyl group on the surface referred to herein means a substance containing an OH-group in the structure formula or a substance that forms an OH-group (surface hydroxyl group) on the surface upon contact with water or the like. An available substance includes but not limited to an inorganic compound made of at least one kind of element among Zn, Ti, Zr, Hf, Ni, Fe, Co, Na, K, Li, Mg, Ca, Sr, Ba, Si, Al, Ga, In, V, Nb, Ta, W, Mo, Cr, Eu, Y, La, Gd, Tb, Ce, Nd, Sm, Rb, and Cs and oxygen, and an organic compound such as a polyvinyl alcohol and copolymer of a polyvinyl alcohol. In a case where a substance having a hydroxyl group on the surface is made of an inorganic compound, the inorganic compound may contain at least one kind of element among B, C, N, S, P, F, and Cl as a dopant. A substance having a hydroxyl group on the surface can be either a crystalline or amorphous substance.

Electroless plating referred to herein means a method of plating a target to be precipitated on a surface by proceeding a reaction not by an electrolytic process but chemically and/or thermally, and it is a method to proceed plating by impregnating a base with a plating solution (by dipping the former in the latter) and setting the temperature of the plating solution to a specific temperature.

The plating solution referred to herein means a solution that contains water or an organic solvent or a mixture thereof as a solvent and at least one kind of raw material of a substance to be plated as a solute and accelerates electroless plating with an additive in the solution. In the invention of the present application, an additive contains at least an alkali to adjust a pH value of the plating solution.

The surface hydroxyl group referred to herein means a hydroxyl group present on the surface of the substance by adsorption of a water molecule or the like. It is known to function not only as an adsorption site, but also as various reaction sites for halogenation, esterification, salt purification, and generation of silanolate (see Non-Patent Document 6 supra). A surface hydroxyl group, such as oxide and oxynitride, and a surface hydroxyl group resulting from an OH-group, a ketone group, and a carboxyl group, are present, and these are thought to function as a reaction site or an adsorption site.

The organic solvent includes an aromatic series, such as ethanol, methanol, isopropanol, butanol, acetylacetone, acetonitrile, ethylene glycol, and benzene.

A raw material of the substance to be plated is a metal compound, and examples of which include but not limited to metal nitrate, metal acetate, metal hydrochloride, metal oxalate, metal alkoxide, metal carbonate, metal sulfate, and at least one kind of salt of metal hydroxide. The metal can be any of Zn, Ti, Zr, Hf, Ni, Fe, Co, Na, K, Li, Mg, Ca, Sr, Ba, Si, Al, Ca, In, V, Nb, Ta, W, Mo, Cr, Eu, Y, La, Gd, Tb, Ce, Nd, Sm, Rb, and Cs. A raw material of the substance to be plated may be in hydrated form to enable the use of a stable substance.

Examples of an additive in the solution referred herein include but not limited to metal hydroxide, metal carbonate hydroxide, metal chloride, metal nitrate, metal acetate, metal carbonate, metal alkoxide, metal sulfate, metal oxalate, and surface active agent. Metal in the additive can be any of Zn, Ti, Zr, Hf, Ni, Fe, Co, Na, K, Li, Mg, Ca, Sr, Ba, Si, Al, Ga, In, V, Nb, Ta, W, Mo, Cr, Eu, Y, La, Gd, Tb, Ce, Nd, Sm, Rb, and Cs. The surface active agent referred to herein is a surface active agent that can be classified into any one of non-ionic, cationic, and anionic active agents as well as an amphoteric active agent having both cations and anions. By performing electroless plating with an addition of such a surface active agent to the plating solution, it is possible to achieve an advantage of making the diameter of needle-like crystals made of zinc oxide smaller and the aspect ratio thereof higher.

The foundation may contain a surface portion of the base.

Also, the producing methods of the invention may further include a step of placing particles on the surface of the base. In this case, the foundation may contain the particles placed on the base. In this case, needle-like crystals are grown using the particles as the seeds.

In a case where the surface of the base does not satisfy the requirements of the foundation as specified above, that is, in a case where it satisfies neither of the requirement that it is made of a plurality of crystal grains that are crystal grains having random crystal orientations and the requirement that it has a hydrophilic surface and is amorphous, when needle-like crystals are grown directly from the surface of the base, the crystal orientations of the needle-like crystals, that is, the directions of growth, are aligned in some cases.

Even in such a case, when the particles placed on the base satisfy the requirements of the foundation, it is possible to randomize the crystal orientations of needle-like crystals grown from the particles (a substance having a surface hydroxyl group). Because the needle-like crystals grown randomly become a three-dimension hindrance to another, they bond one to another, which consequently makes it possible to cover the base substantially with the array of needle-like crystals in the first region.

The step of placing the particles may include a step of preparing a colloidal solution by dispersing the particles (fine particles) in a solution and by applying the colloidal solution to the base by means of dip coating, spray coating, spin coating or dropping. Further, it may include a step of drying and/or calcining when necessity arises.

According to these methods, particles showing the crystal property and having random crystal orientations or amorphous particles can be readily placed on the surface of the base.

The particles may be made of a same material as the microscopic regions.

The step of placing the particles may include a step of forming a thin film made of the particles to have an average thickness of 50 nm or smaller on the base.

When configured in this manner, it is possible to make the needle-like crystals (array) hardly separate from the base.

The step of placing the particles may include a step of forming a thin film made of the particles to have an average thickness of 20 nm or smaller on the base.

When configured in this manner, it is possible to make the needle-like crystals (array) hardly separate from the base in a more reliable manner.

An average film thickness of the thin film can be smaller, for example, as the particles are taken into the needle-like crystals while the needle-like crystals are grown. The average thickness of the thin film at the beginning of the growth of needle-like crystals is preferably 50 nm or smaller, and more preferably, 20 nm or smaller.

The thin film made of the particles is a thin film in which the particles are present homogeneously on the substrate, and it may have voids or asperities on the surface.

In a case where the plating solution contains the alkali at a 0.001 mol concentration to 2 mol concentration, even when the thickness of the thin film made of the particles that become starting points for growth is small, it is possible to obtain an array of needle-like crystals that covers the base substantially completely. When the pH of the plating solution is 13 or higher as in the invention of the present application, even in the presence of a pin hole in the thin film, it is possible to cover the base with needle-like crystals made of zinc oxide substantially completely by increasing the concentration of zinc in the plating solution.

Although the mechanism that gives rise to such a phenomenon is not clear, it is thought that the electrical property and heat conductivity of the plating solution, the catalytic activity of the surface hydroxyl group, the acidity of a hydroxyl group, the surface energy, and so forth change with the concentration of alkali, and the growing rate of needle-like crystals, the wetting property to the base, a crystal automorphic shape, and so forth vary with such a change.

The step of placing the particles may include a step of placing a precursor of a substance forming the particles on the base, and a step of forming the particles by decomposing the precursor.

For example, the step of placing the particles may include a step of dispersing a precursor of a desired compound forming the particles in a solvent and applying the solvent to the base by means of dip coating, spray coating, spin coating or dropping, and a step of placing the desired particles on the base by thermally decomposing the precursor by means of drying and/or calcination.

Examples of decomposition include but not limited to decomposition by heat decomposition, hydrolysis, dehydrocondensation, and plasma irradiation.

BEST MODE FOR CARRYING OUT THE INVENTION

Hereinafter, embodiments of the invention will be described in detail with reference to the accompanying drawings.

FIG. 1 is a schematic cross section of a photovoltaic conversion element according to a first embodiment of the invention.

The photovoltaic conversion element 1 comprises a composite 10 including a transparent electrode 2 serving as the base and an array 4 of a plurality of needle-like crystals 3 formed on the transparent electrode 2. The transparent electrode 2 is made of, for example, tin oxide ($SnO_2$) doped with fluoride (F), and provided, for example, in the form of a flat film on a glass substrate.

The needle-like crystals 3 include first needle-like crystals 3A extending from respective plural starting points S positioned spaced apart from one another on the surface of the transparent electrode 2 at an angle of almost 90° with respect to the surface of the transparent electrode 2 (extending perpendicularly to the surface of the transparent electrode 2), and second needle-like crystals 3B extending from the respective starting points S in directions within a wider angular range encompassing a direction perpendicular to the surface of the transparent electrode 2 (for example, the angle produced with the surface of the transparent electrode 2 is 0° to 90°) and shorter than the first needle-like crystals 3A. In the first and second needle-like crystals 3A and 3B, the longitudinal directions and the c-axes coincide with each other. The first needle-like crystals 3A have almost the same length.

One or more than one first needle-like crystal 3A and one or more than one second needle-like crystal 3B extend from a single starting point S. A clearance is present between adjacent two first needle-like crystals 3A. The tip end (the opposite side to the transparent electrode 2) of the second needle-like crystal 3B extending from a given starting point S abuts on or comes in close proximity to the side surface of the first needle-like crystal 3A or the second needle-like crystal 3B extending from another starting point S adjacent to the given starting point S.

A portion on the surface of the transparent electrode 2 exposed through the first needle-like crystals 3A is substantially (completely) covered with the second needle-like crystals 3B. In short, the surface of the transparent electrode 2 is covered with the needle-like crystals 3 (first and second needle-like crystals 3A and 3B) almost completely. In other words, the entire surface of the transparent electrode 2 is covered with the needle-like crystals 3. Hence, the transparent electrode 2 and the opposite side to the transparent electrode 2 with respect to the array 4 are isolated in a satisfactory manner.

The second needle-like crystals 3B are present in a region (hereinafter, referred as the "first region") R1 in the vicinity of the surface of the transparent electrode 2 with respect to a direction perpendicular to the surface of the transparent electrode 2, and absent in a region (hereinafter, referred to as the "second region") R2 on the tip end side of the first needle-like crystals 3A within an array region of the needle-like crystals 3. Hence, a proportion of the cross section (area) of the needle-like crystals 3 in a plane parallel to the surface of the transparent electrode 2 is lower in the second region R2 than in the first region R1. The orientation degree of the needle-like crystals 3 is low in the first range R1 in comparison with the second range R2. The c-axes of needle-like crystals 3 as a whole (at least in the second region R2) are oriented one another (the frequency at which the c-axes are aligned along a particular direction (a direction perpendicular to the surface of the transparent electrode 2) is high).

The needle-like crystals 3 are made of, for example, gallium-doped zinc oxide and are n-type semiconductors.

A plurality of microscopic regions 7 made of crystals of zinc oxide are present between the transparent electrode 2 and the array 4 (chiefly in the vicinity of the starting points S). The crystal orientations of the respective microscopic regions 7 are random and do not necessarily coincide with the crystal orientations of the needle-like crystals 3.

A counter electrode 6 is provided to oppose almost in parallel to the transparent electrode 2 while being slightly spaced apart from the array 4 (the tip ends of the first needle-like crystals 3A). The counter electrode 6 is, for example, formed of a laminate electrode of nickel and gold.

A p-type semiconductor portion 5 is provided to fill a space between the array 4 and the counter electrode 6, the space including a clearance between adjacent first needle-like crystals 3A and a clearance between the tip ends of the first needle-like crystals 3A and the counter electrode 6. The p-type semiconductor portion 5 is made of, for example, nitrogen-doped zinc oxide or tin sulfide. Because the surface of the transparent electrode 2 is covered with the first and second needle-like crystals 3A and 3B almost completely, the contact area of the p-type semiconductor portion 5 and the transparent electrode 2 is reduced.

A p-n junction is formed by the needle-like crystals 3, which are n-type semiconductors, and the p-type semiconductor portion 5. Dye particles 8, which are a light absorbing material, are provided between the needle-like crystals 3 (n-type semiconductor) and the p-type semiconductor portion 5 (in the vicinity of the interface thereof).

In the photovoltaic conversion element 1, when light comes incident on the p-n junction portion from the transparent electrode 2 side, electron-hole pairs are generated at the p-n junction portion, and holes and electrons migrate to the counter electrode 6 and the transparent electrode 2, respectively. This gives rise to a photoelectric current (photoelectromotive force). In this instance, the dye particles 8 function to assist an active layer (the needle-like crystals 3 and the p-type semiconductor portion 5) for light absorption. It is therefore possible to absorb light introduced inside the element efficiently.

Owing to the use of the needle-like crystals 3, the actual surface area of the first and second needle-like crystals 3A and 3B for the projected area onto the base (transparent electrode 2) is large. Hence, the area of the interface between the needle-like crystals 3 (n-type semiconductor) and the p-type semiconductor portion 5 is also large, which makes it possible to obtain a large photoelectric current (photoelectromotive force). In this case, the needle-like crystals 3 (n-type semiconductor) and the p-type semiconductor portion 5 function as a light receiving material.

In addition, because the contact area of the p-type semiconductor portion 5 and the transparent electrode 2 is reduced, inverse electron migration and a leak current are reduced. The conversion efficiency of the photovoltaic conversion element 1 is therefore high.

Further, because the first needle-like crystals 3A are almost perpendicular to the surface of the transparent electrode 2 and the longitudinal direction of the first needle-like crystals 3A coincides with the c-axis thereof, in a case where the crystal system of the needle-like crystals 3 is, for example, the hexagonal system, the optical and electrochemical properties in the in-plane direction parallel to the surface of the transparent electrode 2 are homogeneous in the second region R2. The optical transparency of the composite 10 with respect to a direction orthogonal to the surface of the transparent electrode 2 therefore is higher.

The microscopic regions 7 may function as particles capable of scattering light. In this case, the photovoltaic conversion efficiency by the light trapping effect can be enhanced owing to the light scattering effect inside the element. The microscopic regions 7 may be conductive fine particles. In this case, it is possible to support the electrical junction between the transparent electrode 2 and the array 4. Further, the microscopic regions 7 may be fluorescent particles furnished with the wavelength conversion function. In this case, the photovoltaic conversion element 1 is able to absorb light having the wavelength out of the light absorption sensitivity of the photovoltaic conversion element 1 as such light undergoes wavelength conversion in the microscopic regions 7 (fluorescent particles), which can in turn enhance the photovoltaic conversion efficiency. The microscopic regions 7, however, may be omitted.

The structure of this photovoltaic conversion element 1 can be applied to a light emitting element. In this case, by applying a suitable voltage to the p-n junction portion formed by the array 4 of the n-type and the p-type semiconductor portion 5 through the transparent electrode 2 and the counter electrode 6, it is possible to generate light by recombination of electrons and holes. In this instance, because the needle-like crystals 3 are oriented with respect to the c-axes thereof, it is possible to inject electrons into the respective needle-like crystals 3 homogeneously.

In addition, in such a light emitting element, because the surface of the transparent electrode 2 is substantially completely covered with the array 4, the p-type semiconductor portion 5 and the transparent electrode 2 are isolated in a satisfactory manner and will not come into contact with each other. It is thus possible to reduce a leak current between the p-type semiconductor portion 5 and the transparent electrode 2, which can in turn increase the light emitting efficiency.

In the case of a light emitting element, when the microscopic regions 7 function as particles capable of scattering light, it is possible, for example, to convert an angle of light incident on the interface between the element and air owing to the light scattering effect inside the element. The external quantum efficiency is therefore enhanced.

The transparent electrode 2 serving as the base and the opposite side to the transparent electrode 2 with respect to the array 4 are isolated in a satisfactory manner virtually by the array 4 (needle-like crystals 3) alone, and no insulator for this isolation is provided among the needle-like crystals 3. This configuration increases the effective surface area of the needle-like crystals 3.

In addition, because no insulator is used to isolate the transparent electrode 2 side and the opposite side to the transparent electrode 2, neither an inconvenience resulting from deterioration or coloring of the insulator, nor diffusion of impurities into the device ascribed to the use of the insulator will occur in the photovoltaic conversion element (or light emitting element) 1.

FIG. 2 is a schematic cross section of a photovoltaic conversion element according to a second embodiment of the invention. In FIG. 2, portions corresponding to the respective portions shown in FIG. 1 are labeled with the same reference characters as those of FIG. 1, and descriptions thereof are omitted herein.

In the photovoltaic conversion element 1A, a composite 20 includes a plurality of third needle-like crystals (external needle-like crystals) 3C extending from the tip ends of particular (part of) first needle-like crystals 3A. The first needle-like crystals 3A without the third needle-like crystals 3C extending from their tip ends are also present. Of the first needle-like crystals 3A, those having the third needle-like crystals 3C extending from the tip ends are present, for example, one in every 10000 to 50000 crystals. The third needle-like crystals 3C extend to the outside of the array region of the first needle-like crystals 3A. The third needle-like crystals 3C also extend in random directions (plural axial directions) within an angular range within which no interference with the array 4 occurs.

The presence of the third needle-like crystals 3C increases the actual surface area of the first through third needle-like crystals 3A through 3C for the projected area onto the transparent electrode 2 in comparison with the case of the photovoltaic conversion element 1 shown in FIG. 1. Hence, in a case where the third needle-like crystals 3C are made of an n-type semiconductor (preferably, the same materials as the first needle-like crystals 3A), in comparison with the case of the photoelectric element 1 shown in FIG. 1, it is possible to increase the area of the p-n junction interface, which can in turn increase a photoelectric current to be generated.

Also, in the photovoltaic conversion element 1A, the third needle-like crystals 3C grown in plural axial directions can achieve an advantage of scattering light. Hence, as is indicated by an arrow L in FIG. 2, light coming incident from the transparent 2 side and passing through the array 4 once without being absorbed in the p-n junction interface is reflected by the third needle-like crystals 3C to be introduced to the p-n junction portion. The conversion efficiency of the photovoltaic conversion element 1A can be thus enhanced.

The third needle-like crystals 3C are not necessarily n-type semiconductors. In this case, the advantage of increasing a photoelectric current owing to an increase of the area of the p-n junction interface cannot be achieved. Nevertheless, it is possible to achieve an advantage of increasing the conversion efficiency by reflecting light having passed through the array 4 onto the p-n junction interface.

The structure of this photovoltaic conversion element 1A can be applied to a light emitting element. In this case, because light emitted from the vicinity of the p-n junction interface to the opposite side to the transparent electrode 2 can be introduced toward the transparent electrode 2 side by reflecting (scattering) the light by the third needle-like crystals 3C, it is possible to enhance the external extraction efficiency for generated light.

FIG. 3 is a schematic cross section of a photovoltaic conversion element according to a third embodiment of the invention. In FIG. 3, portions corresponding to the respective portions shown in FIG. 1 are labeled with the same reference characters as those of FIG. 1, and descriptions thereof are omitted herein.

In the photovoltaic conversion element 11, the surface of the needle-like crystals 3 is covered with a light receiving layer 9 containing a dye in a space on the opposite side to the transparent electrode 2 with respect to the array 4. By covering the surface of the transparent electrode 2 with the needle-like crystals 3 almost completely, the contact area of the light receiving layer 9 and the transparent electrode 2 is reduced. The light receiving layer 9 has a thickness not to fill up a space between adjacent first needle-like crystals 3A.

The surface of the light receiving layer 9 (the surface on the opposite side to the surface of the needle-like crystals 3) is covered with the p-type semiconductor portion 5. A space between adjacent first needle-like crystals 3A is almost completely filled up with the light receiving layer 9 and the p-type semiconductor portion 5.

The photovoltaic conversion element 11 is able to generate a photoelectric current using light absorbed in the light receiving layer 9. A leak current can be reduced by reducing the contact area of the light receiving layer 9 and the transparent electrode 2. In other words, in a case where the light receiving layer 9 is in contact with the transparent electrode 2, holes are given to the transparent electrode 2 from the light receiving layer 9 at a certain probability. Meanwhile, electrons are given to the transparent electrode 2 from the needle-like crystals 3. This increases the recombination probability of electrons and holes in the transparent electrode 2 and the light emitting efficiency is reduced. It is, however, possible to avoid such an event by reducing the contact area of the light receiving layer 9 and the transparent electrode 2.

FIG. 4 is a schematic cross section showing the structure of a capacitor according to the first embodiment of the invention.

The capacitor 21 comprises a composite 30 including a storage node 22 in the shape of a flat plate and serving as the base and an array 24 of a plurality of needle-like crystals 23 formed on the storage node 22. Both of the storage node 22 and the needle-like crystals 23 have the conducting property and serve as one of capacitor electrodes of the capacitor 21. The storage node 22 and the needle-like crystals 23 are made of, for example, zinc oxide that is rendered electrically conductive by aluminum doped therein.

The needle-like crystals 23 include first needle-like crystals 23A extending from respective plural starting points S positioned spaced apart from one another on the surface of the storage node 22 at an angle of almost 90° with respect to the surface of the storage node 22 (perpendicularly to the surface of the storage node 22), and second needle-like crystals 23B extending from the respective starting points S in directions within a wider angular range encompassing a direction perpendicular to the surface of the storage node 22 (for example, the angle produced with the surface of the storage node 22 is 0° to 90°) and shorter than the first needle-like crystals 23A. In the first and second needle-like crystals 23A and 23B, the longitudinal directions and the c-axes coincide with each other. The first needle-like crystals 23A have almost the same length.

One or more than one first needle-like crystal 23A and one or more than one second needle-like crystal 23B extend from a single starting point S. A clearance is present between adjacent two first needle-like crystals 23A. The tip end (the end portion on the opposite side to the storage node 22) of the second needle-like crystal 23B extending from a given starting point S abuts on or comes in close proximity to the side surface of the first needle-like crystal 23A or the second needle-like crystal 23B extending from another starting point S adjacent to the given starting point S.

A portion on the surface of the storage node 22 exposed through the first needle-like crystals 23A is substantially completely covered with the second needle-like crystals 23B. In short, the surface of the storage node 22 is covered with the needle-like crystals 23 (first and second needle-like crystals 23A and 23B) almost completely. In other words, the entire surface of the storage node 22 is covered with the needle-like crystals 23. Hence, the storage node 22 side and the opposite side to the storage node 22 with respect to the array 24 are isolated in a satisfactory manner.

The second needle-like crystals 23B are present in a region (hereinafter, referred as the "first region") R21 in the vicinity of the surface of the storage node 22 with respect to a direction perpendicular to the surface of the storage node 22, and absent in a region (hereinafter, referred to as the "second region") R22 on the tip end side of the first needle-like crystals 23A within an array region of the needle-like crystals 23. Hence, a proportion of the cross section (area) of the needle-like crystals 23 in a plane parallel to the surface of the storage node 22 is lower in the second region R22 than in the first region R21. The orientation degree of the needle-like crystals 23 is low in the first region R21 in comparison with the second region R22. The needle-like crystals 23 as a whole (at least in the second region R22) are oriented with respect to the c-axes thereof.

A plurality of microscopic regions 27 made of crystals of zinc oxide are present between the storage node 22 and the array 24 (chiefly in the vicinity of the starting points S). The crystal orientations of the respective microscopic regions 27 are random and do not necessarily coincide with the crystal orientations of the needle-like crystals 23.

The surface of the needle-like crystals 23 is covered with a protective film (insulating film) 25 made of a dielectric material in a space on the opposite side to the storage node 22 with respect to the array 24. By covering the surface of the storage node 22 with the needle-like crystals 23 almost completely, the contact area of the protective film 25 and the storage node 22 is reduced. The protective film 25 has a thickness not to fill up a space between adjacent first needle-like crystals 23A. The protective film 25 is made of, for example, non-doped zinc oxide.

The surface of the protective film 25 (the surface on the opposite side to the surface of the needle-like crystals 23) is covered with a cell plate 26. The cell plate 26 has the conducting property and serves as the other capacitor electrode. The cell plate 26 is made of, for example, aluminum-doped zinc oxide. A space between adjacent first needle-like crystals 23A is almost completely filled up with the protective film 25 and the cell plate 26. The surface of the cell plate 26 (the surface on the opposite side to the surface of the protective film 25) is covered with another protective film (insulating film) 28. The protective film 28 is made of, for example, non-doped zinc oxide.

As has been described, the capacitor 21 has the structure in which the protective film 25, which is a dielectric material, is sandwiched between the needle-like crystals 23 (and the storage node 22) serving as one of the capacitor electrodes and the cell plate 26 serving as the other capacitor electrode. When a voltage is applied between the storage node 22 and the cell plate 26, the capacitor 21 becomes able to store charges in the vicinity of the interface between the needle-like crystals 23 and the protective film 25 and in the vicinity of the interface between the cell plate 26 and the protective film 25. Because the protective film 25 is of a shape conforming to the surface of the needle-like crystals 23, the area of the interfaces between the protective film 25 and the respective needle-like crystals 23 and cell plate 26 is increased. The electrostatic capacity of the capacitor 21 is therefore large.

In addition, the protective film 25 is hardly in contact with the storage node 22 whereas it is in contact with virtually the array 24 of needle-like crystals 23 alone on the opposite side to the cell plate 26 with respect to the protective film 25. Hence, in a case where the needle-like crystals 23 are made of a single kind of material (oxide), it is possible to apply a voltage across the protective film 25 homogeneously. In addition, no electric double layer is formed between the storage node 22 and the array 24. It is thus possible for the capacitor 21 to enhance the electrostatic capacity.

Further, because the needle-like crystals 23 as a whole are oriented with respect to the c-axes thereof, at least in the second region R22, the electric property thereof is homogenous with respect to the in-plane direction perpendicular to the orientation direction.

As has been described, the capacitor 21 can be formed of the storage node 22 through the protective film 28, all of which are made of zinc oxide with a difference only as to whether the zinc oxide used is doped or not. It goes without saying, however, that the respective portions including the storage node 22 through the protective film 28 (either partially or entirely) can be made of a material other than zinc oxide.

FIG. 5 is a schematic cross section showing the structure of a capacitor according to the second embodiment of the invention. In FIG. 5, portions corresponding to the respective portions shown in FIG. 4 are labeled with the same reference characters as those of FIG. 4, and descriptions thereof are omitted herein.

The capacitor 31 is a so-called electric double layer capacitor, and comprises a composite 40 including a substrate (base) 32 serving as a collector and an array 34 of needle-like crystals 33 in the same morphology as the needle-like crystals 23 (see FIG. 4) that form one of polarizable electrodes of the capacitor 31 together with the substrate 32. The needle-like crystals 33 include first needle-like crystals 33A in the same morphology as the first needle-like crystals 23A and second needle-like crystals 33B in the same morphology as the second needle-like crystals 23B. The surface of the substrate 32 is covered with the needle-like crystals 33 (first and second needle-like crystals 33A and 33B) substantially completely.

Another substrate 36 functioning the other polarizable electrode to serve as a collector is disposed oppositely to the substrate 32 while being spaced apart adequately from the tip ends of the first needle-like crystals 33A. The substrate 36 is made of the same material as the substrate 32.

A space between the array 34 and the substrate 36 (including a space between adjacent first needle-like crystals 33A and a space between the tip ends of the first needle-like crystals 33A and the substrate 36) is filled with an electrolytic solution 35. By covering the surface of the substrate 32 with the needle-like crystals 33 substantially completely, the contact area of the electrolytic solution 35 and the substrate 32 is reduced.

When a voltage is applied between a pair of the substrates 32 and 36, an electric double layer is formed in the vicinity of the interfaces between the respective substrates 32 and 36 and the electrolytic solution 35, which enables the capacitor 31 to store charges.

The use of the needle-like crystals 33 as one of the polarizable electrodes increases the area of the interface between the needle-like crystals 33 and the electrolytic solution 35 at which the electric double layer is formed, which increases the electrostatic capacity of the capacitor 31. It is preferable that a space between adjacent first needle-like crystals 33A forms a mesopore in the order of 2 nm to 50 nm in width. This configuration makes it possible to increase an amount of stored charges. In addition, because the contact area of the electrolytic solution 35 and the substrate 32 is reduced, no leak current resulting from a supporting salt in the electrolyte will occur. In short, a leak current is reduced in this capacitor 31.

Further, activated carbon in the form of an aggregate of fine particles has been used as the polarizable electrode in the conventional electric double layer capacitor. However, the electric resistance is high because of an influence of the grain boundary or the like. On the contrary, because the needle-like crystals 33, that is, needle-like crystals whose major portion are single crystals, are used as the polarizable electrode in the capacitor 31, there is little influence of the grain boundary and the polarizable electrode (needle-like crystals 33) has a high conducting property. The electric conductivity of the needle-like crystals 33 can be controlled by controlling an amount of doping.

Needle-like crystals same as the needle-like crystals 33 may extend from the substrate 36 toward the substrate 32. In this case, it is possible to dispose the needle-like crystals from the substrate 36 and the needle-like crystals 33 from the substrate 32 oppositely so as not come into contact with each other. Accordingly, it is possible to increase the area of the interface between the electrolytic solution 35 and the polarizable electrode (the needle-like crystals extending from the substrate 36) on the substrate 36 side, too. The electrostatic capacity of the capacitor can be therefore increased.

A method for producing the composites 10, 20, 30, and 40 will now be described. The composites 10, 20, 30 and 40 can be obtained by letting the needle-like crystals 3, 23, and 33 be grown on the transparent electrode 2, the storage node 22, or the substrate 32 serving as the base by means of electroless plating using a plating solution (hereinafter, referred to as the "specific plating solution") containing at least one kind of alkali selected from the group consisting of $X^1OH$, where $X^1$ is one of Na, K, and Cs, $X^2{}_2CO_3$, where $X^2$ is one of H, Na, K, and Cs, and $NH_{31}$ and having a pH of 13 or higher.

In this case, the needle-like crystals 3, 23, and 33 are grown using a substance having a hydroxyl group on the surface thereof as a catalyst.

The foundation for the growth of the needle-like crystals 3, 23, and 33 satisfies either one of the requirement that it is made of a plurality of crystal grains that are crystal grains having random crystal orientations and the requirement that it has a hydrophilic surface and is amorphous. An amorphous matrix may be present in a space between a crystal grain and another crystal grain. In a case where the surface portion itself of the base satisfies either one of these requirements, the needle-like crystals 3, 23, and 33 can be grown using the surface portion of the base as the foundation.

Alternatively, particles as the foundation such that satisfies either one of the requirements specified above, for example, particles made of the same material as the microscopic regions 7 and 27, may be placed on the surface of the base before the electroless plating is performed. In this case, the needle-like crystals 3, 23, and 33 are grown using the particles as the seeds in the step of performing the electroless plating. Hence, in this case, it is possible to control the density of the arrays 4, 24, and 34, respectively, of the needle-like crystals 3, 23, and 33 that will be grown with the density of particles to be placed.

In a case where the electroless plating is performed without placing such particles on the surface of the base, the base itself has to be a substance having a hydroxyl group on the surface thereof (it does not matter whether it is a substance that contains an OH-group in the structure formula or it is a substance that forms an OH-group on the surface upon contact with water or the like). Meanwhile, in a case where the electroless plating is performed after the particles are placed on the surface of the base, it is sufficient that the particles are a substance that has a hydroxyl group on the surface thereof and the base does not have to be a substance having a hydroxyl group on the surface thereof.

According to the producing method described above, it is possible to produce the composites 10, 20, 30, and 40 in which the needle-like crystals 3, 23, and 33 are formed at a high density that has not been achieved before. The density of the needle-like crystals 3, 23, and 33 in the second regions R2 and R22 (that is, the density of the first needle-like crystals 3A, 23A, and 33A) measured from a scanning electron micrograph taken from the tip end side of the first needle-like crystals 3A, 23A, and 33A is, for example, 1000 crystals or more per a projected area of 1 µm×1 µm.

By means of electroless plating, not only is it possible to form the arrays 4, 24, and 34 of the homogeneous needle-like crystals 3, 23, and 33, respectively, even on the base having a complicated surface shape, but it is also possible to form the arrays 4, 24, and 34 when the base has no conducting property. Accordingly, various bases become available in comparison with electrolytic plating, which broadens the applicable range of this producing method.

In addition, the forming temperature of the needle-like crystals 3, 23, and 33 by means of electroless plating is 60° C. to 100° C., and preferably 70° C. to 90° C., which eliminates the need to hold the base at high temperatures as in the case of chemical vapor deposition or pulse laser deposition. It is therefore possible to use a material that cannot be used for a reaction at high temperatures, such as plastic, as the base.

Further, according to this producing method, the needle-like crystals are grown to be the needle-like crystals 3, 23, and 33 in various directions from the starting points on the surface of the base (in a case where the producing method includes the step of placing the particles on the surface of the base, the particles become the starting points). This is a noticeable characteristic in comparison with the conventional method for producing needle-like crystals, such as chemical vapor deposition (for example, see Non-Patent Document 1 supra) and electrochemical deposition (for example, see Non-Patent Document 2 supra) where most of the needle-like crystals are grown in a direction almost perpendicular to the surface of the base.

When a plurality of starting points for growth of needle-like crystals are positioned spaced apart from one another on the surface of the base, the surface of the base is exposed through the needle-like crystals grown almost perpendicularly to the surface of the base. On the contrary, according to the producing method of the present invention, a portion on the surface of the base exposed through the needle-like crystals (corresponding virtually to the first needle-like crystals 3A, 23A, and 33A) grown almost perpendicularly to the surface of the base (in such a manner that the angle produced with the surface of the base falls within a specific angular range) is covered with the needle-like crystals (corresponding virtually to the second needle-like crystals 3B, 23B, and 33B) grown in directions far from the direction perpendicular to the surface of the base substantially completely.

In other words, according to the producing method of the present invention, it is possible to produce the composites 10, 20, 30, and 40 in which the base side and the opposite side to the base with respect to the arrays 4, 24, and 34 can be isolated in a satisfactory manner. There is no need to use an insulator subsidiarily for this isolation.

Directions in which the needle-like crystals 3, 23, and 33 are grown also depend on the crystal orientations or the crystal properties in portions that become the starting points from which the needle-like crystals 3, 23, and 33 are grown. For example, in a case where the base has a hydroxyl group, the base can be used as the starting points for growth. However, in a case where the crystal orientations of the base are aligned, there may be a case where the crystal orientations of the needle-like crystals 3, 23, and 33 are aligned during the growth. For example, in a case where an array of zinc oxide needle-like crystals is formed using a zinc oxide thin film formed by means of sputtering as the seeds (see Non-Patent Document 5 supra), the orientations of the zinc oxide needle-like crystals are readily aligned because the crystal orientations have been aligned in the respective portions of the zinc oxide thin film.

Hence, for portions that become the starting points from which the needle-like crystals 3, 23, and 33 are grown, it is preferable that either they show the crystal property and have random crystal orientations or they show no crystal property. For example, in a case where particles (a substance having a surface hydroxyl group) made of the same material as the microscopic regions 7 and 27 show the crystal property and have random crystal orientations or show no crystal property, it is possible to randomize the crystal orientations of the needle-like crystals 3, 23, and 33 grown from the particles that become the seeds. It should be noted, however, that even when the particles that become the seeds have the crystal property, the crystal orientation of a given particle does not necessarily coincide with the crystal orientations of the needle-like crystals 3, 23, and 33 grown from this particle.

In this case, the needle-like crystals 3, 23, and 33 are grown in random directions and bond one to another because each becomes a three-dimensional hindrance to another, which consequently makes it possible to cover the base substantially with the arrays 4, 24, and 34, respectively, of the needle-like crystals 3, 23, and 33 in the first regions R1 and R21.

In a case where, for example, a colloidal solution in which are dispersed the particles (fine particles) that become the starting points for growth of the needle-like crystals 3, 23, and 33 is applied to the base by means of dip coating, spray coating, spin coating, or dropping when the particles are placed on the surface of the base, the crystal orientations of the particles will not align in most cases. In short, it is possible to place particles in random crystal orientations on the base by these methods.

Also, according to the producing method of the present invention, the needle-like crystals 3, 23, and 33 grown from arbitrary starting points in directions far from a direction perpendicular to the surface of the base cannot be grown long as they are hindered by the needle-like crystals 3, 23, and 33 grown from other adjacent starting points, whereas the needle-like crystals 3, 23, and 33 grown in a direction almost perpendicular to the surface of the base can be grown long without being hindered by other needle-like crystals 3, 23, and 33. In this manner, the longitudinal directions of the needle-like crystals 3, 23, and 33 as a whole are aligned. Hence, for example, in a case where the longitudinal directions of the needle-like crystals 3, 23, and 33 coincide with the c-axes thereof, the arrays 4, 24, and 34 of the needle-like crystals 3, 23, and 33, respectively, are oriented with respect to the c-axes thereof.

In order to cover the base substantially with the needle-like crystals 3, 23, and 33, it is necessary that the starting points for growth are present at some degree of density. Hereinafter, assume that the staring points for growth are particles (fine particles).

In a case where the arrays 4, 24, and 34 of the needle-like crystals 3, 23, and 33, respectively, made of zinc oxide are formed, particles (fine particles made of zinc oxide) that become the starting points for growth can be formed, for example, by spin coating an ethanol solution, in which zinc acetate dihydrate (a precursor of zinc oxide) is dissolved, to the surface of the base and subjecting the base to heating (calcination) to let the zinc oxide undergo heat decomposition. It is possible to obtain fine particles made of amorphous zinc oxide and/or fine particles made of crystalline zinc oxide having random crystal orientations depending on the heating temperature. In addition, there may be generated a state where an amorphous matrix made of zinc oxide is present in spaces among fine particles made of crystalline zinc oxide having random crystal orientations.

In this case, by setting the concentration of zinc acetate dihydrate in the ethanol solution to about 0.001 mol/l to about 0.1 mol/l, fine particles made of zinc oxide can be present densely (for example, present so as to form a thin film) to the extent that the needle-like crystals 3, 23, and 33 to be grown will substantially cover the base.

In a case where the concentration of zinc acetate dihydrate in the ethanol solution is too low, the density of fine particles formed on the surface of the substrate becomes too low for the needle-like crystals 3, 23, and 33 to substantially cover the base. It should be noted, however, that even when the concentration is 0.001 mol/l or below, by increasing the number of performing times of spin coating and heat decomposition, particles that become the staring points for growth of the needle-like crystals 3, 23, and 33 can be present densely to the extent that the needle-like crystals 3, 23, and 33 will cover the base densely.

In this case, however, fine particles flocculate partially and the needle-like crystals 3, 23, and 33 are formed on the flocculated fine particles, which makes it impossible to increase the adhesion strength between the base and the needle-like crystals 3, 23, and 33 (arrays 4, 24, and 34). Hence, there may be a case where the base is exposed due to separation of the needle-like crystals 3, 23, and 33. It is therefore preferable to perform the spin coating one to five times.

Meanwhile, when the concentration is higher than about 0.1 mol/l, needle-like crystals 3, 23, and 33 are formed on the flocculated fine particles.

It should be noted that when the needle-like crystals 3, 23, and 33 made of zinc oxide are grown, fine particles made of zinc oxide are taken into the needle-like crystals 3, 23, and 33. Hence, even in a case where the needle-like crystals and the base do not have a direct contact with each other at the beginning of the growth of the needle-like crystals 3, 23, and 33, the needle-like crystals 3, 23, and 33 and the surface of the base can come into direct contact with each other by the time the growth of the needle-like crystals 3, 23, and 33 completes. At a point in time when the growth of the needle-like crystals 3, 23, and 33 completes, if an area where the needle-like crystals 3, 23, and 33 and the base are in a direct contact is large to a certain extent, it is possible to increase the adhesion strength between the base and the needle-like crystals 3, 23, and 33.

As has been described, in a case where the needle-like crystals 3, 23, and 33 are formed on the flocculated fine particles, at a point time when the growth of the needle-like crystals 3, 23, and 33 completes, either the contact area of the base and the arrays 4, 24, and 34 becomes smaller or the base and the arrays 4, 24, and 34 are not in contact with each other. The adhesion strength between the base and the needle-like crystals 3, 23, and 33 consequently becomes weaker, which gives rise to separation of the needle-like crystals 3, 23, and 33. The base is therefore exposed so that it is impossible to substantially cover the base with the arrays 4, 24, and 34 of the needle-like crystals 3, 23, and 33, respectively.

Fine particles made of zinc oxide were obtained when the temperature of heating following the spin coating was 180° C. to 500° C. Even in this temperature range, in the case of heating at low temperatures, it is necessary to extend the heating time to obtain fine particles made of zinc oxide.

As long as the salt (precursor) used undergoes decomposition and particles made of a target material can be obtained, hydrolysis, dehydrocondensation, or plasma irradiation may be performed instead of heat decomposition (including decomposition by microwave heating).

The needle-like crystals 3, 23, and 33 may be grown repetitively by performing electroless plating plural times. In this case, the needle-like crystals 3, 23, and 33 made of the same substance (composition) do not have to be grown in all the times the electroless plating is performed, and the needle-like crystals 3, 23, and 33 made of different substances (compositions) may be grown each time the electroless plating is performed. For example, aluminum-doped needle-like crystals 3, 23, and 33 can be grown by performing electroless plating plural times with the use of a plating solution containing an aluminum supply source. In this case, the concentration of the aluminum supply source in the plating solution may be lowered for electroless plating performed later, so that an amount of aluminum doped into the needle-like crystals 3, 23, and 33 is lower.

The arrays 4, 24, and 34 formed in this manner are suitable for use in a photovoltaic conversion element. Because an amount of aluminum doped into the needle-like crystals 3 is smaller on the second region R2 side, the inverse saturation current density becomes low, and because an amount of aluminum doped into the needle-like crystals 3 becomes larger on the first region R1 side, thereby the resistance value becomes small.

In a case where the needle-like crystals 3, 23, and 33 are formed repetitively through growth, electroless plating does not have to be performed using the specific plating solution specified above in all the times. Once the base is substantially covered with the needle-like crystals 3, 23, and 33 (arrays 4, 24, and 34), the needle-like crystals 3, 23, and 33 may be grown thereafter by means of electroless plating using a plating solution other than the specific plating solution (for example, a plating solution excluding the specific alkali specified above, such as NaOH).

For example, the needle-like crystals 3, 23, and 33 may be grown further using the arrays 4, 24, and 34 in the composites 10, 20, 30 and 40 that can be obtained in the present invention as the seeds by means of electroless plating using a plating solution containing hexamethylene tetramine (a plating solution that does not satisfy the requirements of the specific plating solution), electrochemical deposition, vapor phase deposition, and the like. When configured in this manner, it is possible to form the composites 10, 20, 30, and 40 having a high aspect ratio in which the base is substantially covered with the first regions R1 and R21.

In a case where the producing method includes the step of placing the particles on the surface of the base, a part of the particles may remain as the microscopic regions 7 and 27 after the growth of the needle-like crystals 3, 23, and 33 completes. In this case, it is possible to enhance the adhesion between the needle-like crystals 3, 23, and 33 and the base by the microscopic regions 7 and 27. It is possible to control the adhesion strength between the base and the arrays 4, 24, and 34 with the density of the particles placed on the surface of the base prior to the electroless plating. It is also possible to weaken the adhesion strength between the base and the arrays 4, 24, and 34 with an intention to let the arrays 4, 24, and 34 separate from the base after the arrays 4, 24, and 34 are formed.

In the producing method of the present invention, it is possible to control the length and the density of the needle-like crystals 3, 23, and 33, for example, by controlling a time over which electroless plating is performed. In a case where the composites 10, 20, 30, and 40 obtained in this manner are applied to a capacitor, the electrostatic capacity can be readily controlled.

While the embodiments of the invention have been described, it should be appreciated that the invention can be implemented in other embodiments. For example, each of the first needle-like crystals 3A and 23A extend at an angle of almost 90° with respect to the surface of the base (the transparent electrode 2, the storage node 22, and the substrate 32) in the embodiments above. However, they may extend in a broader angular range, for example, within which the angle produced with the base is 45° to 90°. A composite having such first needle-like crystals can be produced by placing particles serving as the seeds on the base at a lower density to let needle-like crystals be grown therefrom.

It should appreciated that various modifications are possible within the scope of the appended claims.

EXAMPLES

Hereinafter, the invention will be described more concretely in Examples below. It should be appreciated, however, that the invention is not limited to Examples below.

Example 1

The following will describe a case where a composite comprising a base and an array of needle-like crystals of oxide formed by means of electroless plating on the surface of the base was produced.

A glass substrate was prepared and used as the base. A zinc nitrate aqueous solution (0.001 mol/l) was applied on one of the surfaces of the base (hereinafter, referred to the "surface"), and the zinc nitrate aqueous solution was spin coated on the surface of the base by rotating the base at 1500 rotations/min. Further, the base was dried at room temperature followed by calcination at 260° C. The base on the surface of which were placed fine particles of zinc oxide (foundation for the growth of needle-like crystals) was thus obtained.

Subsequently, the base on which were placed the fine particles was dipped in an electroless plating solution within a reaction container (pressure-resistant container) made of Teflon (registered trademark). The electroless plating solution used was made up of water as a solvent and zinc nitrate hexahydrate and sodium hydroxide (NaOH) as a solute. The concentration of zinc nitrate hexahydrate in the plating solution was 0.06 mol/l and the concentration of sodium hydroxide in the plating solution was 0.75 mol/l. The pH of the plating solution was 13.2. When the plating solution was heated at 85° C. for one hour within the reaction container, an array of needle-like crystals made of zinc oxide was formed on the surface of the base.

As is shown in FIG. 6, while the base 124 was dipped in the plating solution 123 (including the time of heating), the base 124 was supported using a supporter 125 in a posture for the surface of the base 124 (the surface on the side where needle-like crystals were to be grown) to face the bottom surface of the reaction containers 121 and 122 (faced downward). When configured in this manner, the density of needle-like crystals grown in plural axial directions from the tip ends of the needle-like crystals that have been grown directly from the base like the third needle-like crystals 3C shown in FIG. 2 becomes lower, which makes it possible to obtain an array with an excellent light transmitting property.

In a case where the producing method using electrolytic plating instead of electroless plating is adopted, the base is limited to a substance having the conducting property. It is therefore difficult to form an array of needle-like crystals on the glass substrate as is in this example. In addition, in a case where an array of needle-like crystals is formed on the base having a complicated shape, such as a designed article, it is difficult to control the electric field concentration in the case of electrolytic plating. However, in the case of electroless plating, a homogeneous array can be readily formed while the producing apparatus is left simple. Further, in a case where an array of needle-like crystals is formed on a large base, provided that only the solvent, the catalyst, and the temperature are placed under the same conditions in essentials, the growing rate of needle-like crystals is almost the same in every point of the base in the case of electroless plating. An array having a uniform thickness can be therefore readily obtained.

FIG. 7A shows scanning electron microscope images of an array obtained in this example (taken in a direction looking down the base perpendicularly (top) and in a direction parallel to the base (bottom)). The diameter of the needle-like crystals was about 80 nm and the length of the needle-like crystals was about 1.4 µm. The density of the needle-like crystals in this instance was about 1800 crystals per square µm.

FIG. 7B is a scanning electron microscope image of the array separated from the bas substance, which is taken from the side where the base was formerly present. In comparison with the opposite side to the base (the second region, see FIG. 7A), the needle-like crystals were present densely on the base side (the first region, see FIG. 7B) in this array.

For the purpose of comparison, a base on the surface of which were placed fine particles of zinc oxide was dipped in a plating solution under the same conditions as in the example above except that the concentration of sodium hydroxide in the plating solution was 0.005 mol/l and the pH of the plating solution was 11.6. No needle-like crystals were observed on the surface of the resulting base and particles of zinc oxide adhered partly onto the base. The average particle diameter of the particles of zinc oxide was about 25 nm.

Also, for the purpose of comparison, a base on the surface of which were placed fine particles of zinc oxide was dipped in a plating solution under the same conditions as in the example above except that the plating solution used (hereinafter, referred to as the "plating solution of Comparative Example") contained zinc nitrate hexahydrate at a concentration of 0.06 mol/l and hexamethylene tetramine at a concentration of 0.75 mol/l. The pH of the plating solution of Comparative Example was found to be in the neighborhood of 7.0 when confirmed with a pH test paper.

When the surface of the resulting base was observed by a scanning electron microscope from a direction perpendicular to the substrate, the base was exposed through the array of needle-like crystals.

The length of the needle-like crystals after the base was dipped in the plating solution for one hour was 1.4 μm when the plating solution of the example (containing sodium hydroxide and having the pH of 13.2) was used. In contrast, the length was in the order of 200 nm when the plating solution of Comparative Example was used. It is therefore understood that the growing rate of the needle-like crystals is slow in a case where the plating solution of Comparative Example was used in comparison with a case where the plating solution of the example was used.

Example 2

The following will describe a case where an array of needle-like crystals made of zinc oxide was formed on the surface of the base by means of electroless plating and a dye sensitizing photovoltaic cell was fabricated using the array as an n-type semiconductor.

A transparent conductive film (F-doped $SnO_2$ having a sheet resistance of 12Ω/☐) formed on one of the surfaces of a glass substrate was prepared and used as the base. The face of the glass substrate on which was formed the transparent conductive film (the surface having the conducting property) was defined as the surface and a zinc nitrate aqueous solution mol/l) was applied on this surface. The zinc nitrate aqueous solution was spin coated on the glass substrate by rotating the glass substrate at 1500 rotations/min, after which the glass substrate was dried at room temperature followed by calcination at 260° C. The base on the surface of which were placed fine particles of zinc oxide was thus obtained.

The base on which were placed the fine particles was dipped in an electroless plating solution within a reaction container. The electroless plating solution used was made up of water as a solvent and zinc nitrate hexahydrate and sodium hydroxide as a solute at concentrations in the aqueous solution of 0.06 mol/l and 0.75 mol/l, respectively. The pH of the plating solution was 13.5. A pressure-resistant container made of Teflon (registered trademark) was used as the reaction container. As with Example 1, the base was dipped in the plating solution in a posture for the surface of the base to face the bottom surface of the reaction container.

When the plating solution was heated at 85° C. for one hour within the reaction container, an array of needle-like crystals made of zinc oxide was formed on the surface of the base. FIG. 8A shows a scanning electron microscope image (taken in a direction looking down the base perpendicularly) of the array after the electroless plating was repeated three times. The diameter of the needle-like crystals was about 80 nm and the length of the needle-like crystals was about 5.2 μm. The density of the needle-like crystals in this instance was about 1700 crystals per square μm.

FIG. 8B is a view showing the X-ray diffraction pattern when the array was separated from the base and the array was measured on the side (first region) where the base was placed and on the opposite side to the substrate (second region).

In the first region, (002), (101), and (100) peaks were obtained. Meanwhile, in the second region, (002) and (101) peaks were obtained but a (100) peak was not obtained. Also, the (101) peak was extremely small in the second region in comparison with that in the first region. In short, the orientation degree of the needle-like crystals in the first region was lower than the orientation degree of the needle-like crystals in the second region.

Subsequently, an ethanol solution in which was dissolved a Ru complex was held at 40 C.° and the array was dipped in this solution for 15 minutes for the Ru dye to be absorbed onto the surface of the array. The counter electrode of the transparent conductive film (the base of the array) used herein was prepared by vapor depositing 1000-angstrom-thick platinum on a transparent conductive film (F-doped $SnO_2$ having a sheet resistance of 12Ω/☐) formed on one of the surfaces of a glass substrate. A spacer was interposed between the counter electrode and the base so that a minute space was defined between the counter electrode and the base, and an electrolytic solution was injected into this minute space. A solution prepared by dissolving lithium iodide and iodine in acetonitrile was used as the electrolytic solution. A dye sensitizing photovoltaic cell was thus obtained.

In comparison with a dye sensitizing photovoltaic cell using fine particles of zinc oxide instead of the needle-like crystals made of zinc oxide, an amount of current was increased by 25% in this dye sensitizing photovoltaic cell when a comparison was made with the one having the same amount of dye.

Example 3

The following will describe a case where an array including an aggregate of needle-like crystals made of zinc oxide and grown in plural axial directions was formed by means of electroless plating and a dye sensitizing photovoltaic cell was fabricated using the array as an n-type semiconductor.

A transparent conductive film (F-doped $SnO_2$ having a sheet resistance of 12Ω/☐) formed on one of the surfaces of a glass substrate was prepared and used as the base. The face of the glass substrate on which was formed the transparent conductive film (the surface having the conductive property) was defined as the surface and a zinc nitrate aqueous solution (0.001 mol/l) was applied on this surface. The zinc nitrate aqueous solution was spin coated on the glass substrate by rotating the glass substrate at 1500 rotations/min, after which the glass substrate was dried at room temperature followed by calcination at 260° C. The base on the surface of which were placed fine particles of zinc oxide was thus obtained.

The base on which were placed the fine particles was dipped in an electroless plating solution within a reaction container. The electroless plating solution used was made up of water as a solvent and zinc nitrate hexahydrate and sodium hydroxide as a solute at concentrations in the aqueous solution of 0.04 mol/l and 0.75 mol/l, respectively. The pH of the plating solution was 13.4. A pressure-resistant container made of Teflon (registered trademark) was used as the reaction container. As with Example 1, the base was dipped in the plating solution in a posture for the surface of the base to face the bottom surface of the reaction container.

When the plating solution was heated at 85° C. for one hour within the reaction container, an array of needle-like crystals made of zinc oxide was formed on the surface of the base.

FIG. 9 shows a scanning electron microscope image of the array (first sample) after the electroless plating was repeated three times. The diameter of the needle-like crystals was about 65 nm in average and the length of the needle-like crystals was about 2.1 μm. The density of the needle-like crystals in this instance was about 1800 crystals per square μm. On the array, aggregates of needle-like crystals (external needle-like crystals) made of zinc oxide and grown in plural axial directions were present sparsely. The density of the aggregates was about 0.03 count per 100 squares μm.

Subsequently, an array (second sample) in which were formed aggregates of external needle-like crystals at a higher density was prepared. Initially, a transparent conductive film (F-doped $SnO_2$ having a sheet resistance of 12Ω/☐) formed on one of the surfaces of a glass substrate was prepared and used as the base. The face of the glass substrate on which was formed the transparent conductive film (the surface having the conducting property) was defined as the surface and a zinc nitrate aqueous solution (0.001 mol/l) was applied on this surface. The zinc nitrate aqueous solution was spin coated on the glass substrate by rotating the glass substrate at 1500 rotations/min, after which the glass substrate was dried at room temperature followed by calcination at 260° C. The base on the surface of which were placed fine particles of zinc oxide was thus obtained.

The base on which were placed the fine particles was dipped in an electroless plating solution within a reaction container. The electroless plating solution used was made up of water as a solvent and zinc nitrate hexahydrate and sodium hydroxide as a solute at concentrations in the aqueous solution of 0.04 mol/l and 0.75 mol/l respectively. The pH of the plating solution was 13.5. A pressure-resistant container made of Teflon (registered trademark) was used as the reaction container. The base was dipped in the plating solution in a posture for the surface of the base to face the opposite side to the bottom surface of the reaction container. When configured in this manner, the density of aggregates of needle-like crystals grown in plural axial directions becomes higher, which makes it possible to obtain an array having an excellent light scattering property.

When the plating solution was heated at 85° C. for one hour within the container, an array of needle-like crystals made of zinc oxide was formed on the surface of the base. FIG. 10 shows a scanning electron microscope image of the array after the electroless plating was repeated three times. The diameter of the needle-like crystals was in the neighborhood of 65 nm in average and the length of the needle-like crystals was about 3.5 μm. Aggregates of needle-like crystals (external needle-like crystals) grown in plural axial directions were formed on the array (needle-like crystals grown directly on the substrate) at a density higher than in the first sample (almost across the entire surface of the array).

The density of the needle-like crystals grown directly on the base in this instance was about 1800 crystals per square μm. The density of aggregates of external needle-like crystals was about 9 counts per 100 squares μm.

Subsequently, a dye was absorbed into these two arrays (first and second samples). Initially, an ethanol solution in which was dissolved a Ru complex was held at 40 C.° and the arrays were dipped in this solution for 15 minutes for the Ru dye to be absorbed onto the surface of each array. The counter electrode of the transparent conductive film (the base of the array) used herein was prepared by vapor depositing 1000-angstrom-thick platinum on a transparent conductive film (F-doped $SnO_2$ having a sheet resistance of 12Ω/☐) formed on one of the surfaces of a glass substrate. A spacer was interposed between the counter electrode and the base so that a minute space was defined between the counter electrode and the base, and an electrolytic solution was injected into this minute space. A solution prepared by dissolving lithium iodide and iodine in acetonitrile was used as the electrolytic solution. Dye sensitizing photovoltaic cells respectively using the first and second samples were thus obtained.

The dye sensitizing photovoltaic cell using the second sample had an amount of current per unit dye amount 30% higher than that in the dye sensitizing photovoltaic cell using the first sample. Also, an amount of absorbed dye in the second sample was twice as large as that in the first sample, and the conversion efficiency of the dye sensitizing photovoltaic cell using the second sample was increased by a factor of two.

Example 4

The following will describe a case where an organic-inorganic hybrid solid state photovoltaic cell was fabricated. In this example, an array of needle-like crystals made of zinc oxide as an n-type semiconductor was formed on the surface of the base by means of electroless plating, and poly-3-hexylthiophene was used as a p-type charge transporting layer and a light receiving material.

A transparent conductive film (F-doped $SnO_2$ having a sheet resistance of 12Ω/☐) formed on one of the surfaces of a glass substrate was prepared and used as the base. The face of the glass substrate on which was formed the transparent conductive film (the surface having the conducting property) was defined as the surface and a zinc nitrate aqueous solution (0.001 mol/l) was applied on this surface. The zinc nitrate aqueous solution was spin coated on the glass substrate by rotating the glass substrate at 1500 rotations/min, after which the glass substrate was dried at room temperature followed by calcination at 260° C. The base on the surface of which were placed fine particles of zinc oxide was thus obtained.

The base on which were placed the fine particles was dipped in an electroless plating solution within a reaction container. The electroless plating solution used was made up of water as a solvent and zinc nitrate hexahydrate and sodium hydroxide as a solute at concentrations in the aqueous solution of 0.06 mol/l and 0.75 mol/l, respectively. The pH of the plating solution was 13.4. A pressure-resistant container made of Teflon (registered trademark) was used as the reaction container.

When the plating solution was heated at 85° C. for one hour within the container, an array of needle-like crystals made of zinc oxide was formed on the surface of the base. When confirmed by a scanning electron microscope, the diameter of the needle-like crystals was found to be about 65 nm in average and the length of the needle-like crystals was found to be about 1.3 μm. The density of the needle-like crystals in this instance was about 1700 crystals per square μm.

The base was dipped in the plating solution in a posture for the surface of the base to face the bottom surface of the reaction container.

The counter electrode of the transparent conductive film (the base of the array) used herein was prepared by vapor depositing 1000-angstrom-thick gold on a transparent conductive film (F-doped $SnO_2$ having a sheet resistance of 12Ω/☐) formed on a glass substrate. The array of needle-like crystals made of zinc oxide and the counter electrode were opposed to each other and a spacer was interposed in a space therebetween so that a minute space was defined between the array and the counter electrode. By repetitively performing a step of injecting a solution prepared by dissolving poly-3- hexylthiophene in chlorobenzene into this minute space followed by drying at 80° C., poly-3-hexylthiophene was provided in this minute space.

In a case where poly-3-hexylthiophene including the array of needle-like crystals made of zinc oxide obtained in the manner described above was used, the photovoltaic conversion was enhanced by 50% in comparison with a case where fine particles of zinc oxide were used instead of the array.

Example 5

The following will describe a case where plastic was used as the base and an array of needle-like crystals was formed on the surface of the base by means of electroless plating.

Polyvinyl alcohol processed to have a shape of a flat plate was prepared and used as the base. Subsequently, fine particles of zinc oxide were prepared as follows. Initially, a first solution was obtained by adding zinc acetate dihydrate to 40 ml of methanol at a concentration of 0.01 mol/l, and dissolving the former in the latter by heating at 60° C. Also, a second solution was obtained by adding a potassium hydroxide to 20 ml of methanol at a concentration of 0.03 mol/l. The second solution was heated to 60° C. and dropped slowly into the first solution with stirring. After the resulting mixed solution was held at 60° C. for eight hours, fine particles of zinc oxide having an average particle diameter of about 10 nm were obtained in the mixed solution.

After the mixed solution was cooled, methanol was added to the mixed solution and the mixed solution was mixed satisfactorily with stirring. Thereafter, the mixed solution was subjected to centrifugal separation at a rotation speed of about 3000 rotations/min to let the fine particles of zinc oxide precipitate, and a supernatant was disposed of. The fine particles of zinc oxide were rinsed by repeating the process from the addition of methanol to the disposal of supernatant as above five times.

The resulting fine particles of zinc oxide were dispersed again in methanol, which was spin coated on the base by rotating the base at 1500 rotations/min followed by drying at room temperature. The fine particles of zinc oxide were thus placed on the surface of the base. The base on which were placed the fine particles of zinc oxide was dipped in an electroless plating solution within a reaction container. The electroless plating solution used was made up of water as a solvent and zinc nitrate hexahydrate and sodium hydroxide as a solute at concentrations in the aqueous solution of 0.06 mol/l and 0.25 mol/l, respectively. The pH of the plating solution was 13.1. A pressure-resistant container made of Teflon (registered trademark) was used as the reaction container. The base was dipped in the plating solution in a posture for the surface of the base to face the bottom surface of the reaction container.

When the plating solution was heated at 80° C. for 30 minutes within the reaction container, an array of needle-like crystals made of zinc oxide was formed on the surface of the base. When confirmed by a scanning electron microscope, the diameter of the needle-like crystals was found to be in the neighborhood of 80 nm and the length of the needle-like crystals was found to be about 0.6 μm. The density of the needle-like crystals in this instance was about 1500 crystals per square μm.

In Examples 1 through 5 above, the concentration of zinc nitrate hexahydrate used as a raw material of the zinc oxide needle-like crystals was 0.04 mol/l or 0.06 mol/l. However, an array of needle-like crystals can be obtained when the concentration of zinc nitrate hexahydrate is 0.01 mol/l to 2 mol/l and more preferably, needle-like crystals can be grown at a concentration of 0.03 mol/l to 0.07 mol/l. Also, in Examples 1 through 5 above, the concentration of sodium hydroxide was 0.75 mol/l or 0.25 mol/l. However, an array of needle-like crystals was obtained when the concentration of sodium hydroxide was 0.1 mol/l to 1 mol/l.

Example 6

The following will describe a case where a comparison was made between dye sensitizing photovoltaic cells respectively using, as the n-type semiconductor, an array of zinc oxide needle-like crystals that substantially covered the surface of the base and an array of zinc oxide needle-like crystals formed for the base to be exposed prepared by electroless plating.

A glass substrate on one of the surfaces of which was formed a transparent conductive film (F-doped $SnO_2$ having a sheet resistance of 12Ω/□) was prepared. The face of the glass substrate on which was formed the transparent conductive film (the surface having the conducting property) was defined as the surface and a zinc acetate ethanol solution (0.03 mol/l) was applied on this surface. The zinc acetate ethanol solution was spin coated on the glass substrate by rotating the glass substrate at 1500 rotations/min, after which the glass substrate was dried at room temperature followed by calcination at 260° C. The base on the surface of which was formed a thin film made of fine particles of zinc oxide was thus obtained. An average thickness of the resulting thin film (measured by an atom force microscope) was 7 nm.

The base on which were placed the fine particles (thin film) was dipped in an electroless plating solution within a reaction container for electroless plating to take place. The electroless plating solution used was made up of water as a solvent and zinc nitrate hexahydrate and sodium hydroxide as a solute. The concentration of zinc nitrate hexahydrate in the plating solution was 0.06 mol/l and the concentration of sodium hydroxide in the plating solution was 0.75 mol/l. A pressure-resistant container made of polypropylene was used as the reaction container. As with Example 1, the base was dipped in the plating solution in a posture for the surface of the base to face the bottom surface of the reaction container.

When the plating solution was heated at 80° C. for one hour within the reaction container, an array of needle-like crystals made of zinc oxide was formed on the surface of the base. The electroless plating was repeated twice.

The diameter of the resulting needle-like crystals was about 65 nm and the length of the needle-like crystals was about 3.2 μm. The density of the needle-like crystals in this instance was about 1000 crystals per square μm. In this manner, an array of zinc oxide needle-like crystals that covered the base densely (substantially) was obtained.

For the purpose of comparison, an array of needle-like crystals formed for a part of the base to be exposed was produced. A glass substrate on one of the surfaces of which was formed a transparent conductive film (F-doped $SnO_2$ having a sheet resistance of 12Ω/□) was prepared. The face of the glass substrate on which was formed the transparent conductive film (the surface having the conducting property) was defined as the surface. After an isopropanol solution in which were dispersed fine particles of zinc oxide was dip coated on this surface, the glass substrate was dried at room temperature followed by heating at 150° C. A thin film made of fine particles of zinc oxide was formed on the surface of the base by repeating these dip coating, drying, and calcining steps three times. An average thickness of the resulting thin film was 70 nm.

The base on which were placed the fine particles (thin film) was dipped in an electroless plating solution within a reaction container for electroless plating to take place. The electroless plating solution used was made up of water as a solvent and zinc nitrate and sodium hydroxide as a solute. The concentration of zinc nitrate in the plating solution was 0.06 mol/l and the concentration of sodium hydroxide in the plating solution was 0.75 mol/l. A pressure-resistant container made of polypropylene was used as the reaction container. As with Example 1, the base was dipped in the plating solution in a posture for the surface of the base to face the bottom surface of the reaction container.

When the plating solution was heated at 80° C. for one hour within the reaction container, an array of needle-like crystals made of zinc oxide was formed on the surface of the base. When the electroless plating was repeated twice, the diameter of the resulting needle-like crystals was about 80 nm and the length of the needle-like crystals was about 3.0 μm. The density of the needle-like crystals in this instance was about 900 crystals per square μm. In this manner, the array of zinc oxide needle-like crystals covering the base densely was obtained.

Before the following step (step of letting a Ru dye be absorbed) was performed, a part of the array separated from the base, which generated a portion where the base was exposed through the array.

Subsequently, an ethanol solution in which was dissolved an Ru complex was held at 40° C., and the bases on which were respectively formed two kinds of arrays were dipped in the solution for 15 minutes for an Ru dye to be absorbed in the surface of each array. An amount of absorbed Ru dye was made equal in each array.

Subsequently, as the counter electrode of the transparent conductive film (the base of the array), an electrode was prepared by vapor depositing 1000-angstrom-thick platinum on a transparent conductive film (F-doped $SnO_2$ having a sheet resistance of 12Ω/□) formed on one of the surfaces of a glass substrate. By interposing a spacer between the counter electrode and the base on which the array (the Ru dye was absorbed in the surface thereof) was formed, a minute space was defined between the counter electrode and the array, and an electrolytic solution was injected into this minute space. A solution prepared by dissolving lithium iodide and iodine in acetonitrile was used as the electrolytic solution. Dye sensitizing photovoltaic cells were obtained.

FIG. 11 shows current (current density) versus voltage characteristics of the resulting dye sensitizing photovoltaic cells measured under irradiation of artificial solar light. The curve b1 shows the characteristic of the dye sensitizing photovoltaic cell using the array of zinc oxide needle-like crystals through which a part of the base was exposed, and the curve b2 shows the characteristic of the dye sensitizing photovoltaic cell using the array of zinc oxide needle-like crystals substantially covering the base.

The conversion efficiency of the dye sensitizing photovoltaic cell using the array of zinc oxide needle-like crystals substantially covering the base was about 2.5 times higher than that of the dye sensitizing photovoltaic cell using zinc oxide needle-like crystals through which a part of the base was exposed.

Example 7

A composite (hereinafter referred to as the "base covered type composite") in which the base was covered with an array of needle-like crystals substantially completely and a composite (hereinafter, referred to as the "base exposed type composite") in which the base was exposed through an array of needle-like crystals were produced. A current versus voltage characteristic of the array was measured for each composite.

The producing conditions of the base covered type composite were as follows.

A transparent conductive film (F-doped $SnO_2$ having a sheet resistance of 12Ω/□) formed on one of the surfaces of a glass substrate was prepared and used as the base. The face of the glass substrate on which was formed the transparent conductive film (the surface having the conducting property) was defined as the surface and a zinc acetate ethanol solution (0.01 mol/l) was applied on this surface. The zinc acetate ethanol solution was spin coated on the glass substrate by rotating the glass substrate at 1500 rotations/min, after which the glass substrate was dried at room temperature followed by calcination at 260° C. The base on the surface of which were placed fine particles of zinc oxide was thus obtained.

Subsequently, the base on which were placed the fine particles was dipped in an electroless plating solution within a reaction container (pressure-resistant container) made of Teflon (registered trademark). The electroless plating solution used was made up of water as a solvent and zinc nitrate hexahydrate and sodium hydroxide as a solute. The concentration of zinc nitrate hexahydrate in the plating solution was 0.04 mol/l and the concentration of sodium hydroxide in the plating solution was 0.75 mol/l. The pH of the plating solution was 13.6. When the plating solution was heated at 80° C. for one hour within the reaction container, an array of needle-like crystals made of zinc oxide and substantially covering the surface of the base was formed on the surface of the base.

The producing conditions for the base exposed type composite were as follows.

A transparent conductive film (F-doped $SnO_2$ having a sheet resistance of 12Ω/□) formed on one of the surfaces of a glass substrate was prepared and used as the base. The face of the glass substrate on which was formed the transparent conductive film (the surface having the conducting property) was defined as the surface and a zinc acetate ethanol solution (0.01 mol/l) was applied on this surface. The zinc acetate ethanol solution was spin coated on the glass substrate by rotating the glass substrate at 1500 rotations/min, after which the glass substrate was dried at room temperature followed by calcination at 260° C. The base on the surface of which were placed fine particles of zinc oxide was thus obtained.

Subsequently, the base on which were placed the fine particles was dipped in an electroless plating solution within a reaction container (pressure-resistant container) made of Teflon (registered trademark). The electroless plating solution used was made up of water as a solvent and zinc nitrate hexahydrate and hexamethylene tetramine as a solute. The concentration of zinc nitrate hexahydrate in the plating solution was 0.04 mol/l and the concentration of hexamethylene tetramine in the plating solution was 0.06 mol/l. The pH of the plating solution was 8. When the plating solution was heated at 80° C. for one hour within the reaction container, an array of needle-like crystals made of zinc oxide was formed on the surface of the base. The surface of the base was exposed through the array of needle-like crystals.

In both the base covered type composite and the base exposed type composite, the needle-like crystals (array) were semiconductors. Whether the array covered the base was confirmed from cross sectional SEM images.

FIG. 12 shows current versus voltage characteristics of the base exposed type composite and the base covered type composite. To enable the measurement, a gold electrode was formed by vapor depositing gold so as to cover the array on the opposite side to the base (on the second region side). The current versus voltage characteristics shown in FIG. 12 were obtained by applying a voltage between the gold electrode and the transparent electrode serving as the base in a dark place and by measuring a current flowing between these electrodes.

The base exposed type composite showed an ohmic characteristic as indicated by the curve a1, which reveals that the two electrodes short-circuited. Meanwhile, the base covered type composite shows a non-linear (non-ohmic) current versus voltage characteristic as indicated by the curve a2, which reveals that the two electrodes did not short-circuit.

Example 8

Arrays were formed using three kinds of seeds for the growth of needle-like crystals. In each case, needle-like crystals were formed on the surface of the base by means of electroless plating. In this example, a transparent conductive film (F-doped $SnO_2$ having a sheet resistance of 12Ω/□) formed on one of the surfaces of a glass substrate was prepared and used as the base.

The face of the glass substrate on which was formed the transparent conductive film (the surface having the conducting property) was defined as the surface and a 2-methoxyethanol solution was spin coated on this surface, after which the glass substrate was dried at 60° C. for 24 hours followed by calcination at 500° C. in air for one hour. A thin film (a seed of the first kind) made of fine particles of zinc oxide and having an average film thickness of 90 nm was thus formed on the surface of the base. The 2-methoxyethanol solution used was prepared by dissolving zinc acetate dihydrate at a concentration of 0.01 mol/l and monoethanolamine at a concentration of 0.01 mol/l in a solvent.

Also, the face of the glass substrate on which was formed the transparent conductive film (the surface having the conducting property) was defined as the surface, and a zinc oxide thin film (a seed of the second kind) was formed on this surface by means of sputtering using zinc oxide at a purity of 99.9% as the target. The average film thickness of the thin film of zinc oxide was 50 nm.

Further, the face of the glass substrate on which was formed the transparent conductive film (the surface having the conducting property) was defined as the surface, and a zinc acetate ethanol solution (0.03 mol/l) was spin coated on this surface while the base was rotated at a speed of 1500 rotations/min, after which the glass substrate was dried at room temperature followed by calcination at 260° C. for two hours. A base on the surface of which was formed a thin film (a seed of the third kind) made of fine particles of zinc oxide was thus obtained. The average film thickness of the thin film obtained in this manner was found to be about 8 nm through evaluation by an atomic force microscope.

Subsequently, the bases on which were respectively formed the seeds of three kinds were dipped in an electroless plating solution within a reaction container for electroless plating to take place. The electroless plating solution used was made up of water as a solvent and zinc nitrate hexahydrate and sodium hydroxide as a solute. The concentration of zinc nitrate hexahydrate in the plating solution was 0.06 mol/l and the concentration of sodium hydroxide in the plating solution was 0.75 mol/l. The pH of the plating solution was 13.2. A pressure-resistant container made of polypropylene was used as the reaction container.

As with Example 1 above, each base was dipped in the plating solution in a posture for the surface of the base to face the bottom surface of the reaction container. After the plating solution was heated at 80° C. for one hour, the plating solution was replaced with a new plating solution. Then, the new plating solution was heated at 80° C. for one hour again. An array of needle-like crystals was thus obtained.

The average thickness of the array of needle-like crystals formed using the seed of the first kind was 3.6 μm. When the array was visually observed immediately after the growth of crystals completed (before rinsing), the base was substantially covered with the array. However, when the array (composite) was handled later, a part of the array separated from the base. Cracking and separation were confirmed in part of the array when confirmed with the use of a scanning electron microscope, which reveals that it was not possible to cover the base with the array.

The average thickness of the array of needle-like crystals formed using the seed of the second kind was 3.3 μm. When this array was confirmed with the use of a scanning electron microscope, the first needle-like crystals extending in a direction producing an angle with the surface of the base such that falls within a specific angular range and the second needle-like crystals extending in directions within a wider angular range encompassing the specific angular range and shorter than the first needle-like crystals were confirmed. A range of angles produced between the base and the second needle-like crystals was narrow and the base was not covered with the array.

The average thickness of the array of needle-like crystals formed using the seed of the third kind was about 3.4 μm. When this array was confirmed with the use of a scanning electron microscope, the array covered the base across the entire surface of the base where plating was applied and no separation of the array occurred.

Example 9

A composite of needle-like crystals made of zinc oxide was formed on a base under the same conditions as those in Example 1.

The resulting array of zinc oxide needle-like crystals had the same structure as the array 4 shown in FIG. 2, and a plurality of third needle-like crystals (external needle-like crystals) extended from the tip ends of a part of the first needle-like crystals.

FIG. 13A and FIG. 13B are views showing EBSP's when the array of zinc oxide needle-like crystals was separated from the base and observed from the first region side and from the second region side, respectively. In FIG. 13A and FIG. 13B, a plane producing a larger angle with the 001 plane is illustrated in a pale color (close to white).

It is understood from the EBSP (FIG. 13A) observed from the first region side that the orientations of zinc oxide needle-like crystals vary in the vicinity of the surface on the first region side of the array of zinc oxide needle-like crystals.

In contrast, because the plane along the longitudinal direction of the zinc oxide needle-like crystals is perpendicular to the 001 plane, it is understood from the EBSP (FIG. 13B) observed from the second region side that the zinc oxide needle-like crystals as a whole are oriented with respect to the c-axes thereof in the vicinity of the plane on the second region side of the array of zinc oxide needle-like crystals.

Referring to FIG. 13B, a region (denoted by alpha-numeral c1 in FIG. 13B) where the orientations of needle-like crystal were disturbed (the orientation degree is different from those in the other regions) is present in part. This region with disturbed orientations corresponds to a region where external needle-like crystals (see the third needle-like crystals 3C of FIG. 2) were present. In the EBSP of FIG. 13B, the array of needle-like crystals is oriented in the 001 direction except for this region (the region where zinc oxide needle-like crystals were oriented with respect to the c-axes thereof is denoted as alpha-numeral c2 in FIG. 13B).

As has been described, by confirming the EBSP of the array of needle-like crystals, it is possible to confirm a difference of the orientation degree between the first region and the second region of the array of needle-like crystals by avoiding an influence of the external needle-like crystals.

FIG. 14A and FIG. 14B are frequency distributions of the plane orientation of zinc oxide needle-like crystals obtained by analyzing EBSP's shown in FIGS. 13A and 13B, respectively. The abscissa is used for the angle produced between a plane in the observed region with the 001 plane, and the ordinate is used for the frequency (area reference) of the plane with which the angle is produced.

On the first region side (see FIG. 14A), planes in all the plane orientations with the angle of gradient from the 001 plane ranging from 0 degree to 90 degrees were confirmed. In contrast, on the second region side (see FIG. 14B), the frequency was concentrated within an angular range close to the 001 plane. A region with the angle of gradient close to 90 degrees was also observed. This region, however, is a region corresponding to the external needle-like crystals.

Example 10

The following will describe a case where an array of needle-like crystals made of zinc oxide was formed on the surface of the base by means of electroless plating and a dye sensitizing photovoltaic cell was fabricated using the array as an n-type semiconductor.

A transparent conductive film (F-doped $SnO_2$ having a sheet resistance of 12Ω/□) formed on one of the surfaces of a glass substrate was prepared and used as the base. The face of the glass substrate on which was formed the transparent conductive film (the surface having the conducting property) was defined as the surface and a zinc acetate ethanol solution (0.03 mol/l) was applied on this surface. The zinc acetate aqueous solution was spin coated on the glass substrate by rotating the glass substrate at 1500 rotations/min, after which the glass substrate was dried at room temperature followed by calcination at 260° C. The base on the surface of which were placed fine particles of zinc oxide was thus obtained.

The base on which were placed the fine particles was dipped in an electroless plating solution within a reaction container for electroless plating to take place. The electroless plating solution used was made up of water as a solvent and zinc nitrate hexahydrate and sodium hydroxide as a solute at concentrations in the aqueous solution of 0.04 mol/l and 0.75 mol/l, respectively. A pressure-resistant container made of polypropylene was used as the reaction container. As with Example 1, the base was dipped in the plating solution in a posture for the surface of the base to face the bottom surface of the reaction container.

When the plating solution was heated at about 85° C. for one hour within the reaction container, an array of needle-like crystals made of zinc oxide was formed on the surface of the base. In short, the needle-like crystals were oriented. The diameter of the needle-like crystals was about 45 nm and the length of the needle-like crystals was about 1.8 μm. The density of the needle-like crystals in this instance was about 1000 crystals per square μm.

For the purpose of comparison, a thin film (first thin film) containing randomly oriented needle-like crystals was produced. After a reaction solution, particles of zinc oxide as the seeds of growth, a stirrer whose surface was covered with Teflon (registered trademark) were put into a pressure-resistant container made of polypropylene, the lid was closed and the mixture was heated at 85° C. for one hour with magnetic stirring at a rotation speed of 800 rotations/min. The needle-like crystals were thus obtained.

The reaction solution used was made up of water as a solvent and zinc nitrate hexahydrate and sodium hydroxide as a solute at concentrations in the aqueous solution of 0.04 mol/l and 0.75 mol/l, respectively. An amount of the reaction solution used was 40 ml. The average particle diameter of the particles of zinc oxide was 20 nm and an amount of added particles of zinc oxide was 0.01 g.

According to this method, a reaction solution in which were dispersed zinc oxide needle-like crystals was obtained. The reaction solution was subjected to centrifugal separation at a rotation speed of 10000 rotations/min for ten minutes to isolate the supernatant from the precipitate, and the supernatant was disposed of while distilled water was added to the precipitate. This operation was performed repetitively until the pH of the supernatant became about 7. The resulting precipitate was dried at 40° C. and wet-kneaded with acetylacetone, polyethylene glycol, and distilled water. A paste containing zinc oxide needle-like crystals was thus obtained.

An operation to apply this paste to a transparent conductive film (F-doped $SnO_2$ having a sheet resistance of 12Ω/□) formed on one of the surfaces of a glass substrate followed by drying at 130° C. and calcination at 450° C. for one hour was repeated three times. A first thin film containing randomly oriented zinc oxide needle-like crystals was thus obtained. The film thickness of the first thin film was 4.7 μm.

Further, for the purpose of comparison, a thin film (second thin film) made of fine particles of zinc oxide was produced. A paste of fine particles of zinc oxide was obtained by wet-kneading fine particles of zinc oxide having an average particle diameter of 20 nm with acetylacetone, polyethylene glycol, and distilled water. An operation to apply this paste to a transparent conductive film (F-doped $SnO_2$ having a sheet resistance of 12Ω/□) formed on one of the surfaces of a glass substrate followed by drying at 130° C. and calcination at 450° C. for one hour was repeated three times. A second thin film containing randomly oriented fine particles of zinc oxide was thus obtained. The film thickness of the second thin film was about 4.5 μm.

Dye sensitizing photovoltaic cells respectively using the array, the first thin film, and the second thin film were produced by the procedure as follows.

Initially, an ethanol solution in which was dissolved an Ru complex was held at 40° C., and together with a glass substrate on which a transparent conductive film serving as the base was formed, each of the array and the two kinds of thin films was dipped in the solution for 15 minutes for an Ru dye to be absorbed in the surfaces of the array and each thin film. The counter electrode to the transparent conductive film (the base of the array) used herein was prepared by vapor depositing 1000-angstrom-thick platinum on a transparent conductive film (F-doped $SnO_2$ having a sheet resistance of 12Ω/□) formed on one of the surfaces of a glass substrate.

By interposing a spacer between the counter electrode and the base, a minute space was defined therebetween and an electrolytic solution was injected into this minute space. A solution prepared by dissolving lithium iodide and iodine in acetonitrile was used as the electrolytic solution. Dye sensitizing photovoltaic cells were thus obtained.

The dye sensitizing photovoltaic cells fabricated in this manner were compared under the conditions that the power generation area was about two squares centimeter and an amount of absorbed dye was about 95 nanomol/square centimeter. As a consequence, the conversion efficiency per unit dye amount was the highest with the dye sensitizing photovoltaic cell using the array (array of zinc oxide needle-like crystals of the present invention) and the lowest with the one using the first thin film (the thin film containing randomly oriented zinc oxide needle-like crystals).

In reference to an amount of power generation by the dye sensitizing photovoltaic cell using the first thin film, an amount of power generation by the one using the array was 210% higher and the one using the second thin film was 80% higher.

The electrochemical properties were evaluated by measuring impedance of the array and the thin films (samples) of the two kinds. The measurement was performed by means of triode measurement under irradiation of white light. Aluminum foil was connected to the sample to be measured and used as a working electrode while a counter electrode made of platinum and a reference electrode made of silver were used. As the electrolyte, an acetonitrile solution containing iodine at 0.05 mol/l and lithium iodide at 0.1 mol/l was used.

The measurement was made by the alternating-current impedance method. The subject was held for one minute under irradiation of light in a state where no voltage was applied and a stable voltage was used as the applied voltage. The frequency range of the measurement was set to 100 kHz to 100 mHz.

The results were shown in FIG. 15 in the form of the Bode diagram. Referring to FIG. 15, the curve g1 shows the measurement result of the oriented needle-like crystals (array), the curve g2 shows the measurement result of the thin film (first thin film) made of non-oriented zinc oxide needle-like crystals, and the curve g3 shows the measurement result of the thin film (second thin film) made of fine particles of zinc oxide. It is understood that a response rate of the oriented needle-like crystals (array) is higher than those of the other samples.

Example 11

The following will describe a case where a composite comprising a base and an array of needle-like crystals of oxide formed on the surface of the base by means of electroless plating was produced.

A glass substrate (made of so-called soda glass) was prepared and used as the base. A Kapton tape (registered trademark) was sticked on one of the surfaces of the base as a mask, and the face on which was sticked this tape was defined as the back surface and the face on which was sticked no tape was defined as the surface.

Subsequently, the base was dipped in an electroless plating solution within a reaction container (pressure-resistant container) made of Teflon (registered trademark). The used electroless plating solution was made up of water as a solvent and zinc nitrate hexahydrate and sodium hydroxide (NaOH) as a solute. The concentration of zinc nitrate hexahydrate in the plating solution was 0.06 mol/l and the concentration of sodium hydroxide in the plating solution was 0.75 mol/l. The pH of the plating solution was 13.2. When the plating solution was heated at 85° C. for three hours within the reaction container, an array of needle-like crystals made of zinc oxide was formed on the surface of the base.

As with Example 1, while the base was dipped in the plating solution (including the time of heating), the base was supported using a supporter in a posture for the surface of the base (the surface on the side where needle-like crystals were to be grown) to face the bottom surface of the reaction container (faced downward). When configured in this manner, the density of needle-like crystals grown in plural axial directions from the tip ends of needle-like crystals that have been grown directly from the base becomes lower, which makes it possible to obtain an array having an excellent light transmitting property.

When confirmed by an electron microscope, the base was substantially covered with the array of needle-like crystals in the resulting composite. The diameter of needle-like crystals was about 750 nm at the largest and about 60 nm at the smallest. The length of needle-like crystals was in the neighborhood of 3 µm. The density of needle-like crystals in this instance was about 18 crystals per square µm.

In a case where the producing method using electrolytic plating instead of electroless plating is adopted, the base is limited to a substance having the conducting property. It is therefore difficult to form an array of needle-like crystals on the glass substrate as was in this example. In addition, in a case where an array of needle-like crystals is formed on the base having a complicated shape, such as a designed article, it is difficult to control the electric field concentration in the case of electrolytic plating. However, in the case of electroless plating, a homogeneous array can be readily formed while the producing apparatus is left simple. Further, in a case where an array of needle-like crystals is formed on a large base, when only the solvent, the catalyst, and the temperature are placed under the same conditions in essentials, the growing rate of needle-like crystals is almost the same in every point of the base in the case of electroless plating. An array having a uniform thickness can be therefore readily obtained.

Even in a case where needle-like crystals are grown directly from the glass substrate as in this example, it is possible to achieve the advantage of electroless plating (see Example 1) in comparison the electrolytic plating.

Figure 1:
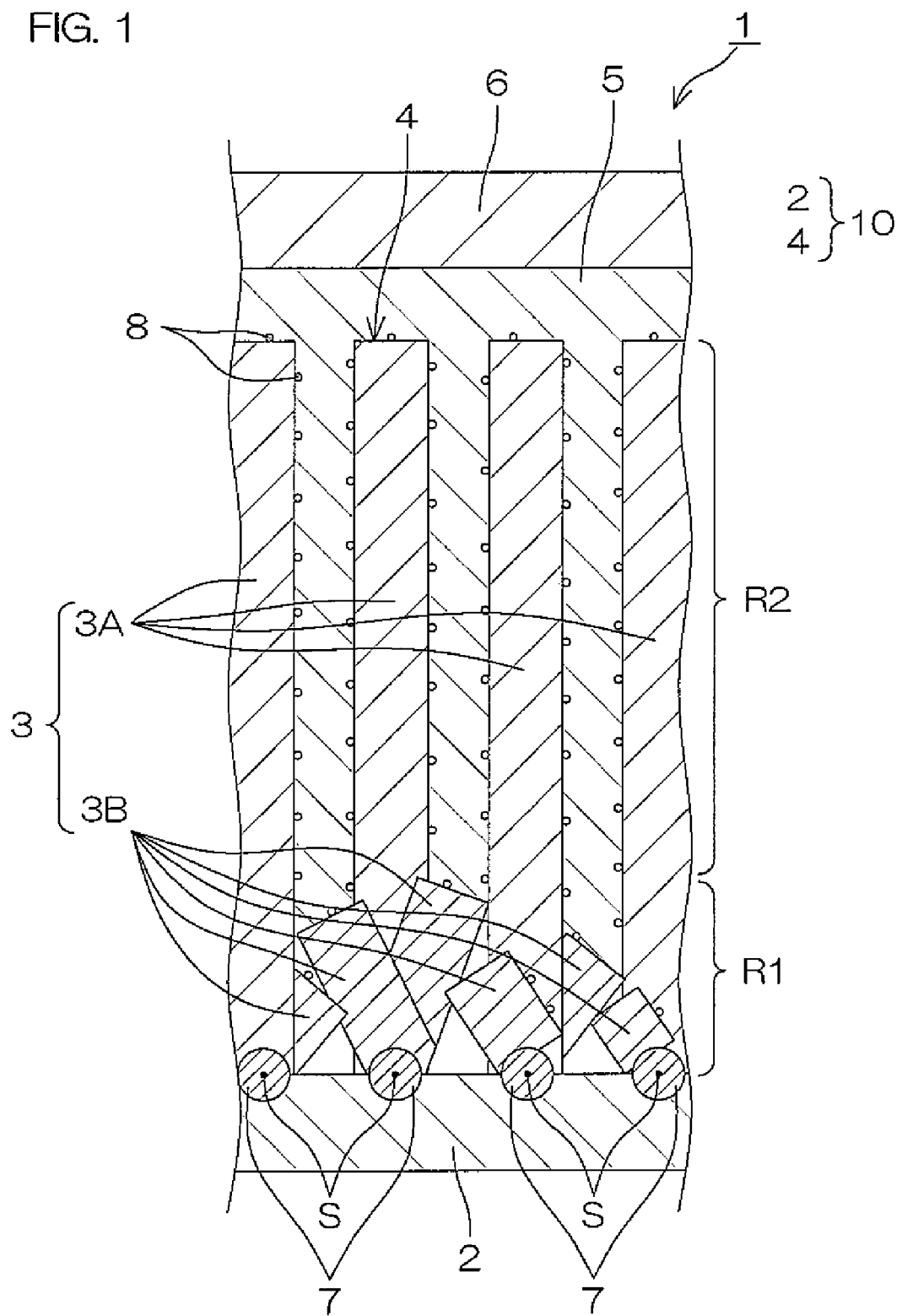
FIG. 1 is a schematic cross section of a photovoltaic conversion element according to a first embodiment of the present invention.
Figure 2:
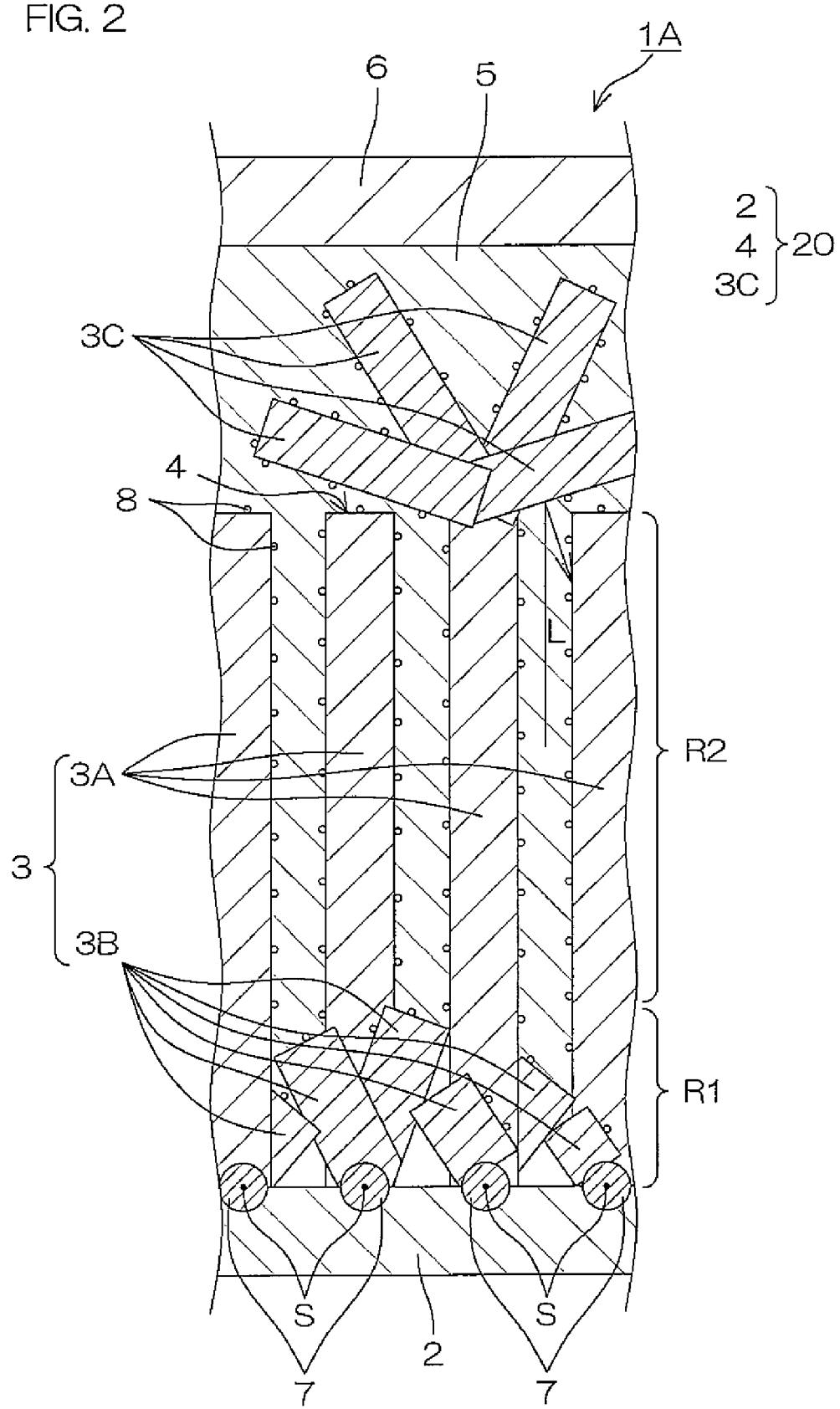
FIG. 2 is a schematic cross section of a photovoltaic conversion element according to a second embodiment of the present invention.
Figure 3:
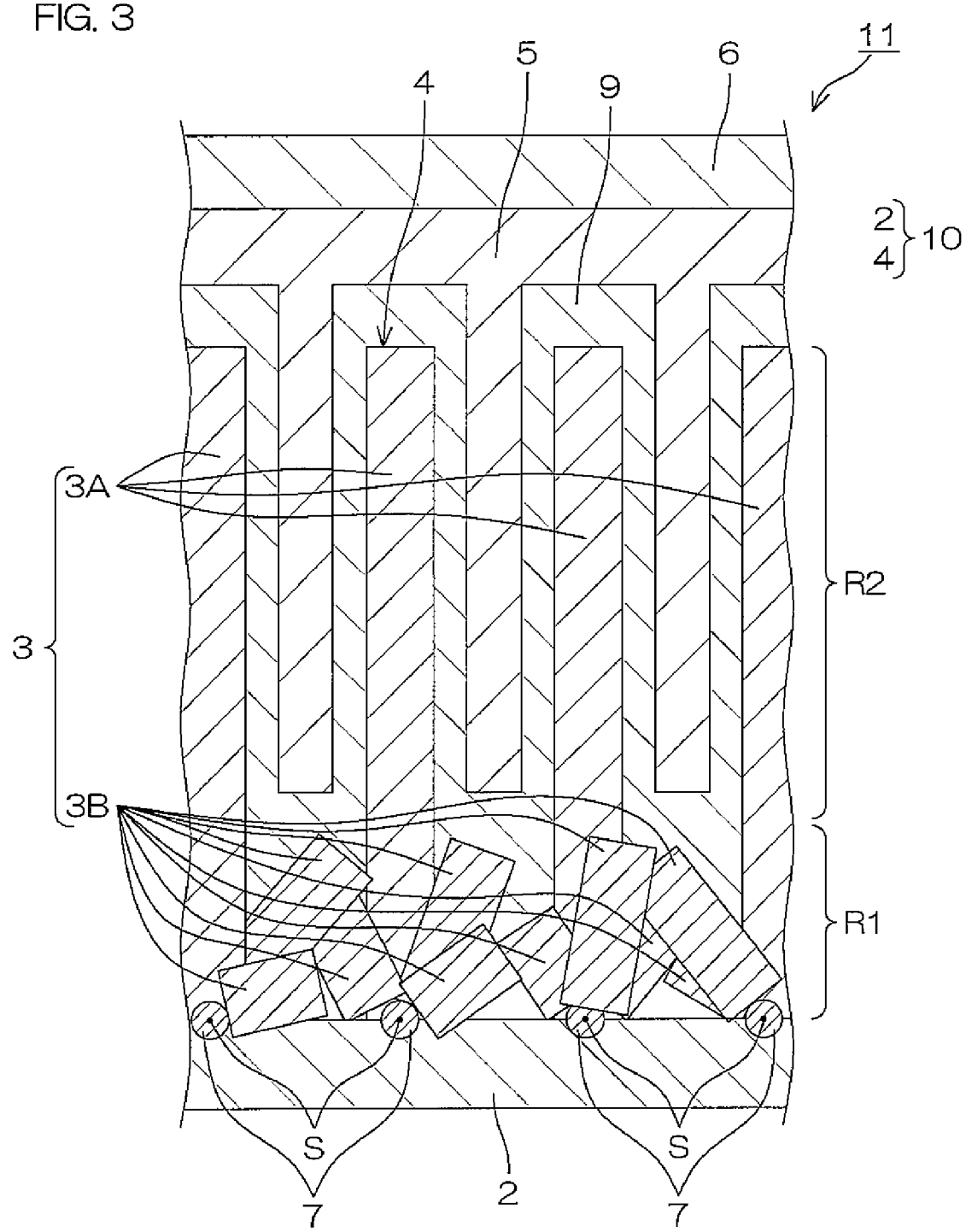
FIG. 3 is a schematic cross section of a photovoltaic conversion element according to a third embodiment of the present invention.
Figure 4:
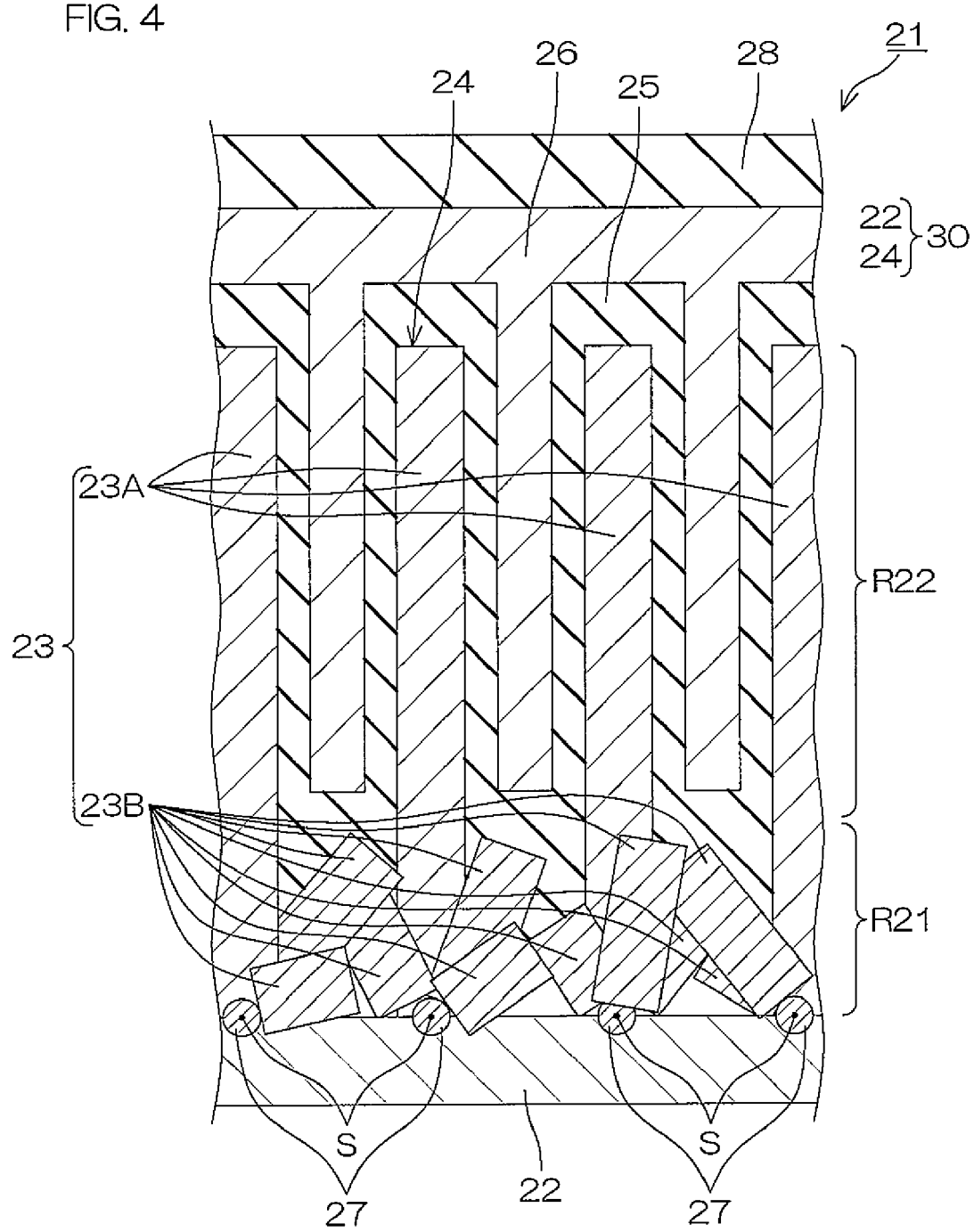
FIG. 4 is a schematic cross section of a capacitor according to a first embodiment of the present invention.
Figure 5:
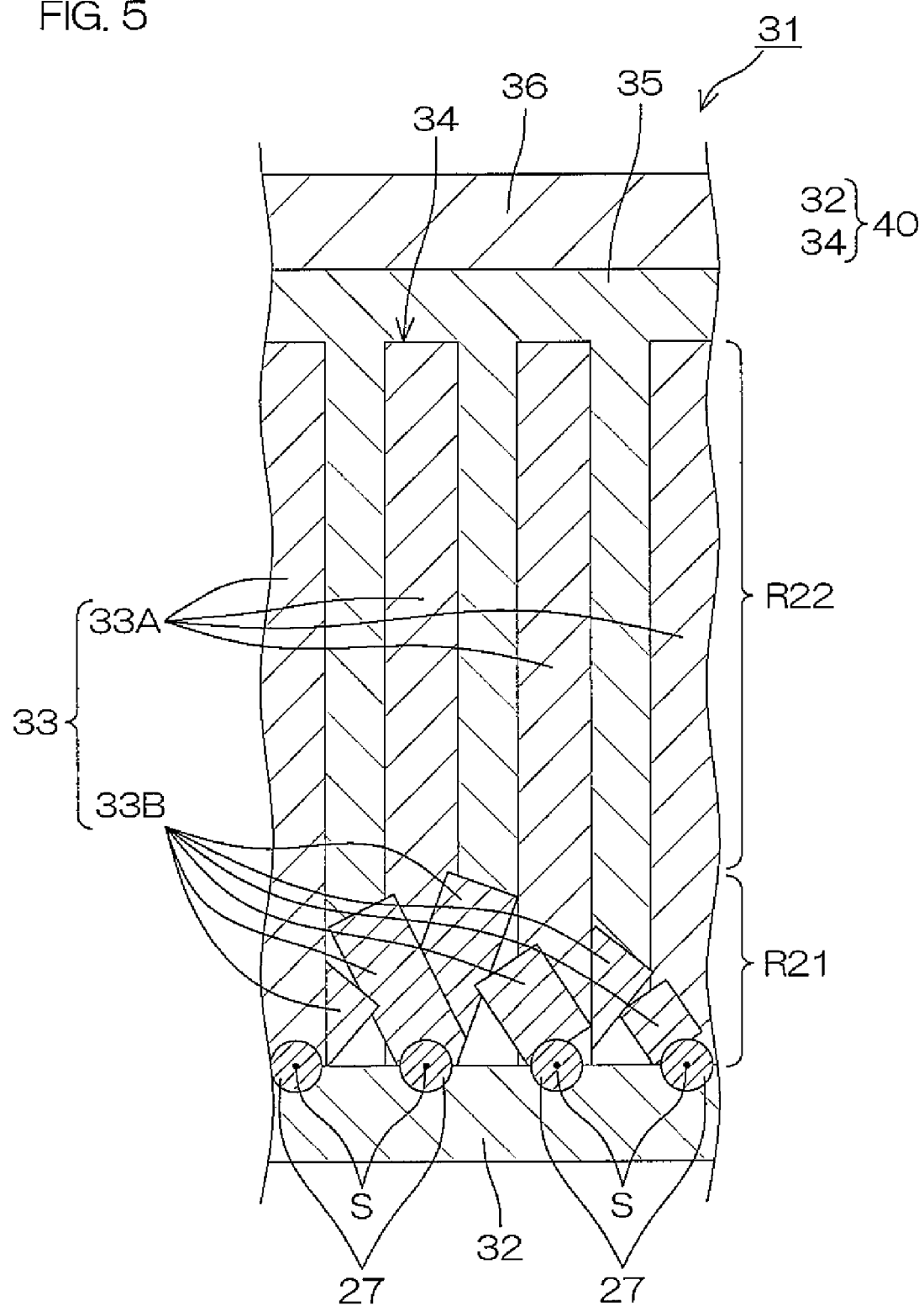
FIG. 5 is a schematic cross section of a capacitor according to a second embodiment of the present invention.
Figure 6:
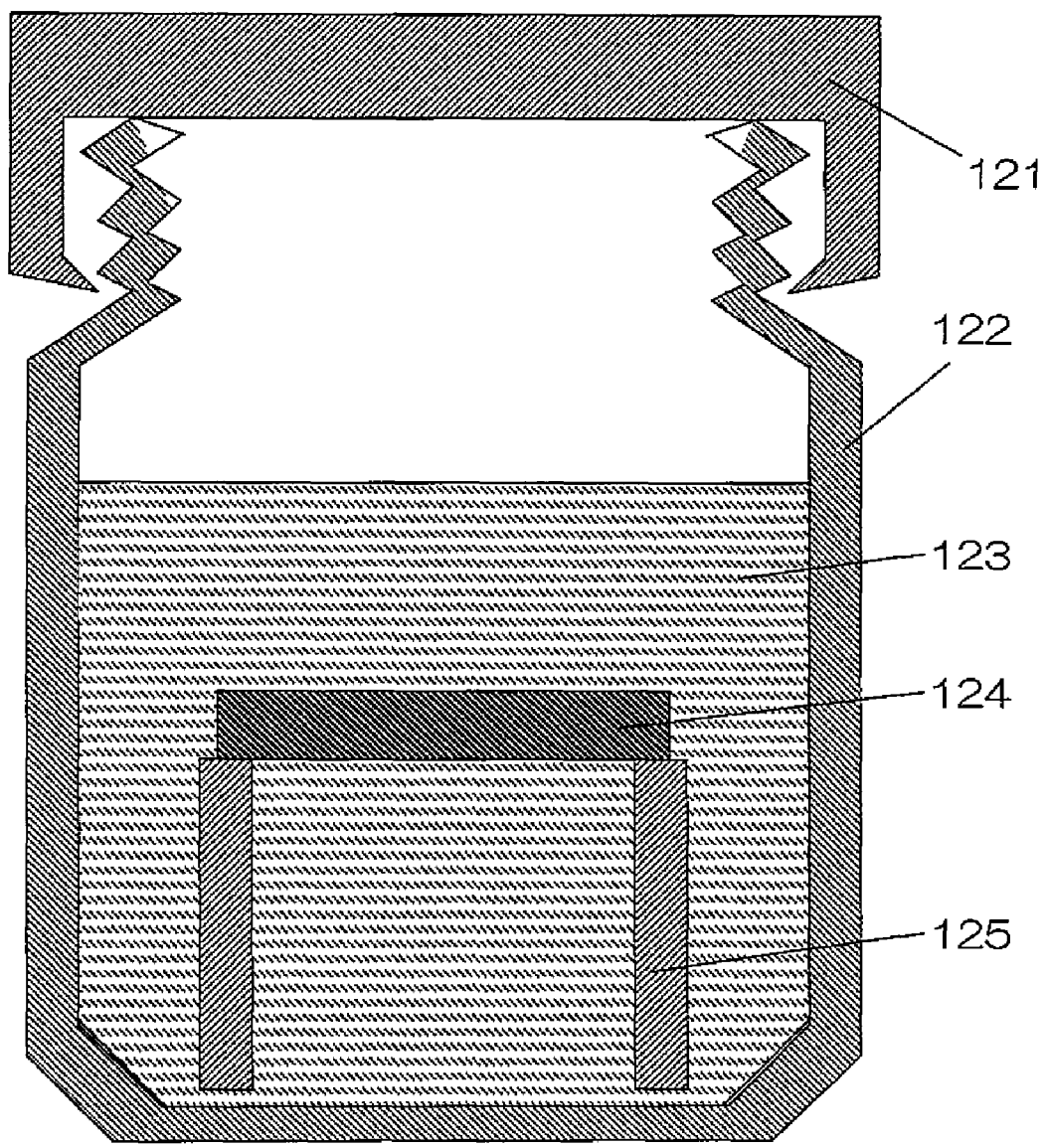
FIG. 6 is a cross section showing a posture of a base within a reaction container during electroless plating.
Figure 7A:
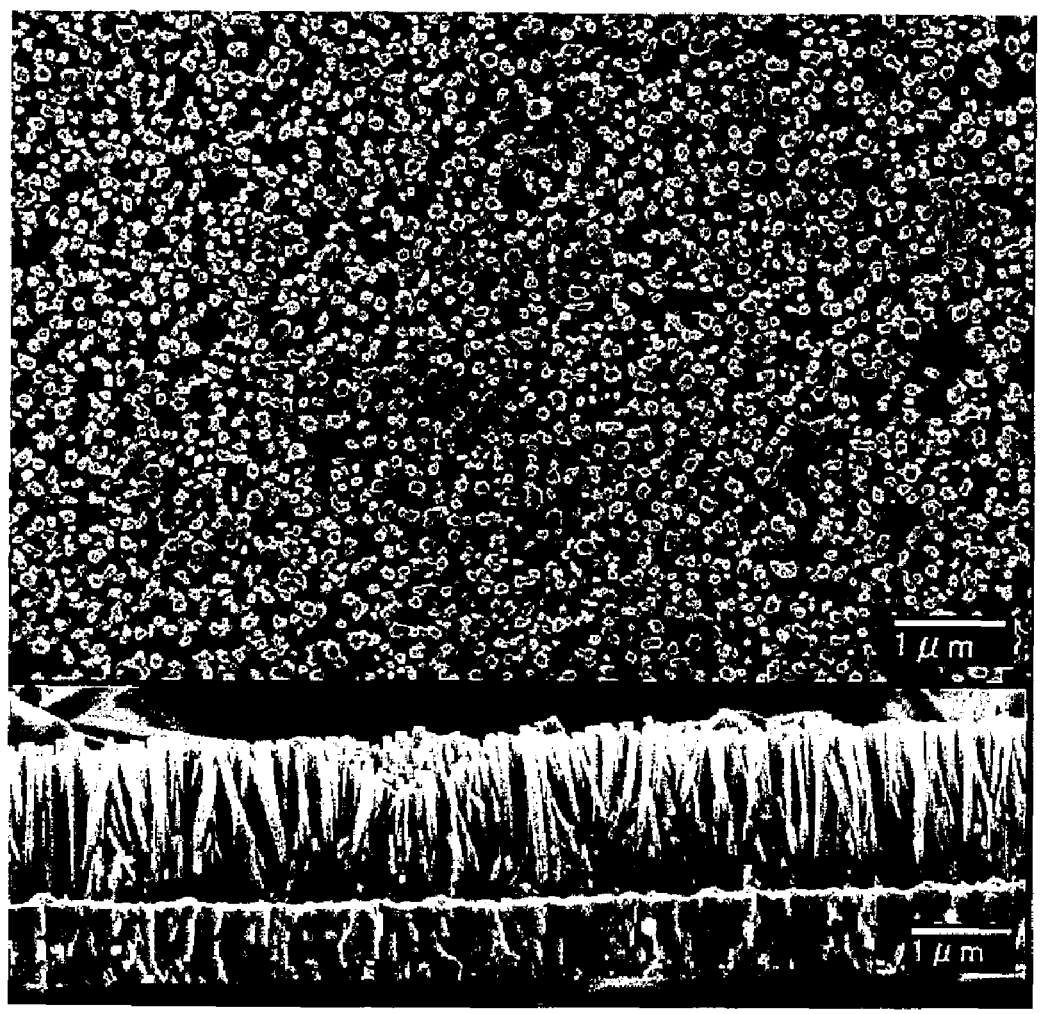
FIG. 7A shows scanning electron microscope images of an array of Example 1.
Figure 7B:
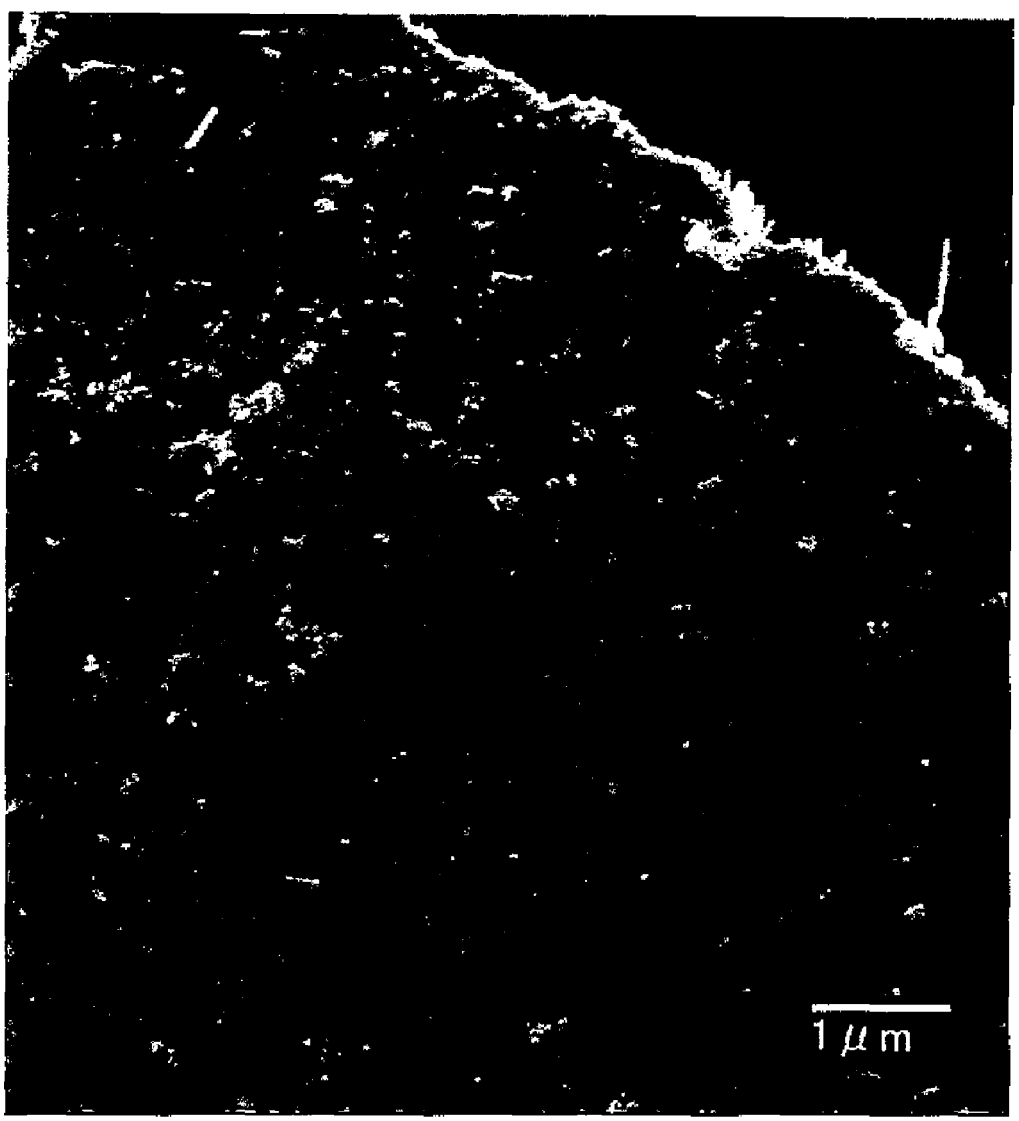
FIG. 7B is a scanning electron microscope image of the array shown in FIG. 7A when it is separated from the base, which is taken from the side where the base was present.
Figure 8A:
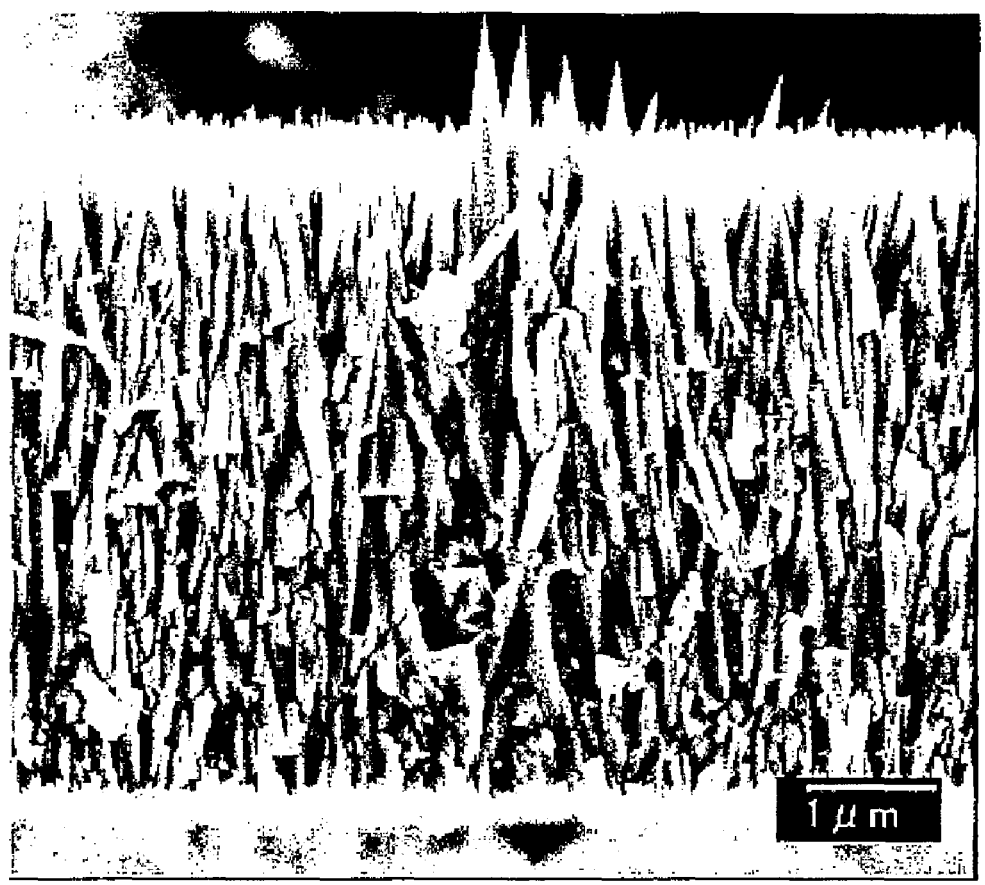
FIG. 8A is a scanning electron microscope image of an array of Example 2.
Figure 8B:
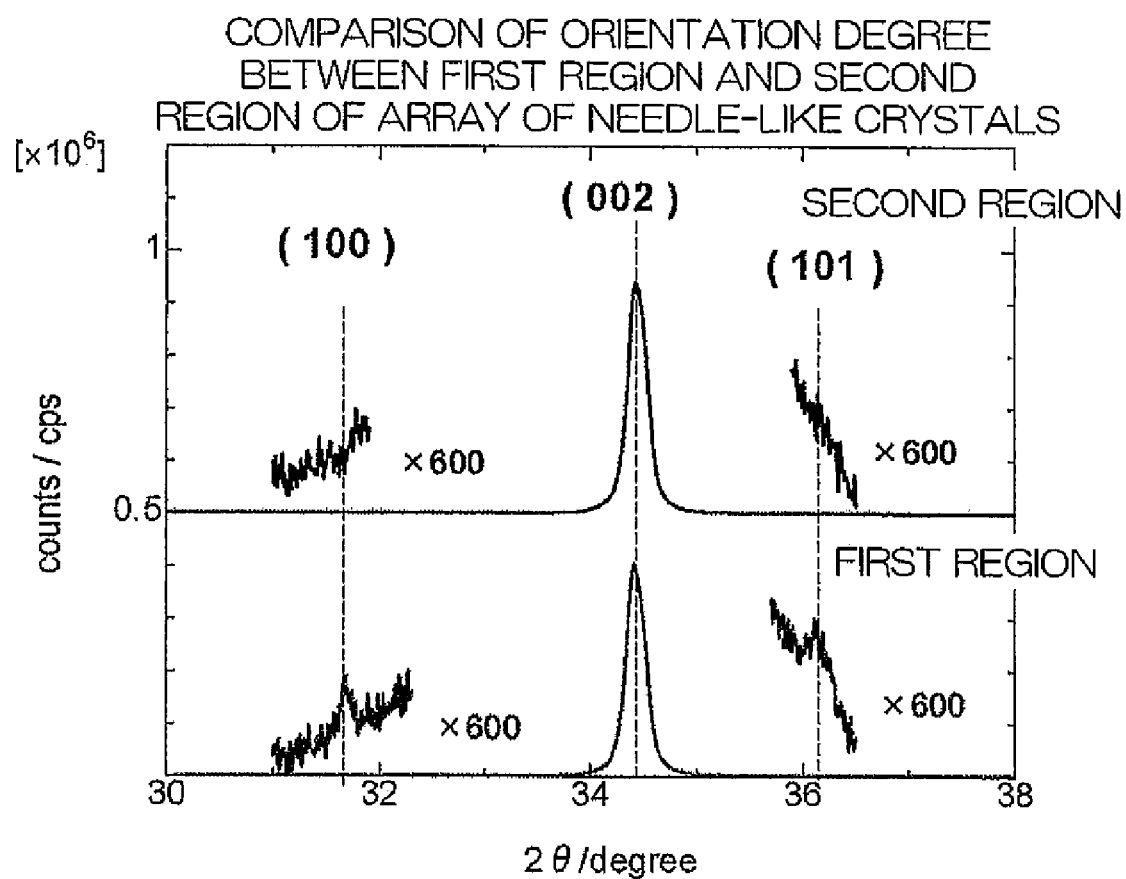
FIG. 8B is a view showing the X-ray diffraction pattern of the array shown in FIG. 8A measured on a side (first region) where the base was placed and on the opposite side to the base (second region).
Figure 9:
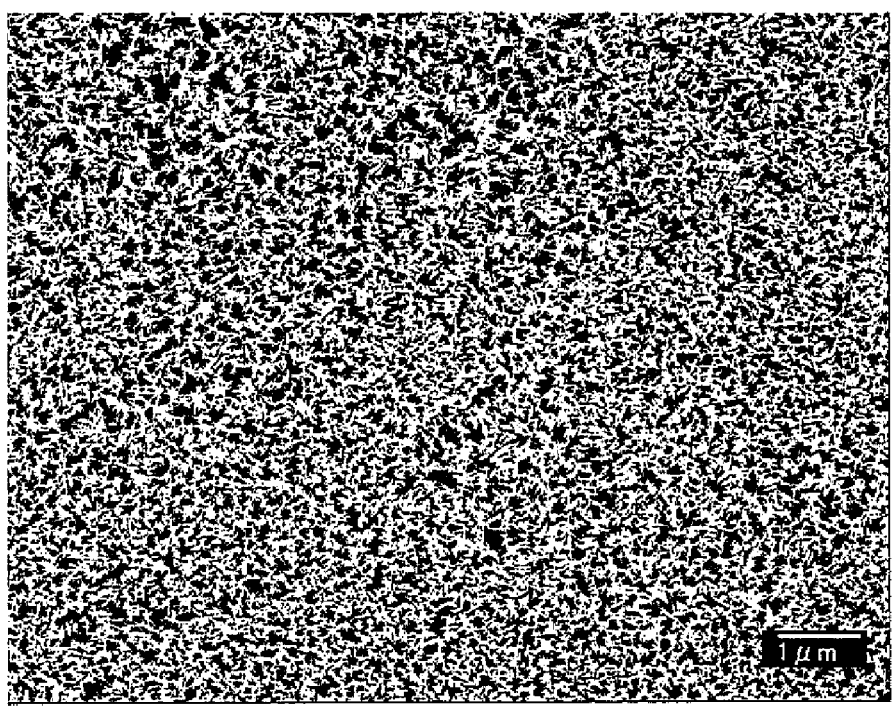
FIG. 9 is a scanning electron microscope image of an array (first sample) of Example 3.
Figure 10:
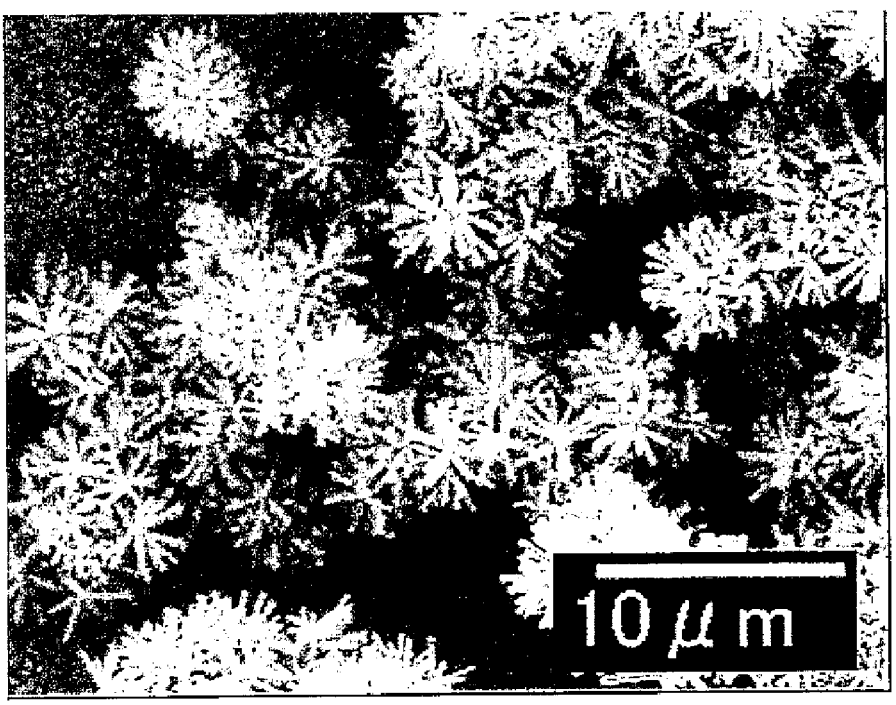
FIG. 10 is a scanning electron microscope image of another array (second sample) of Example 3.
Figure 11:
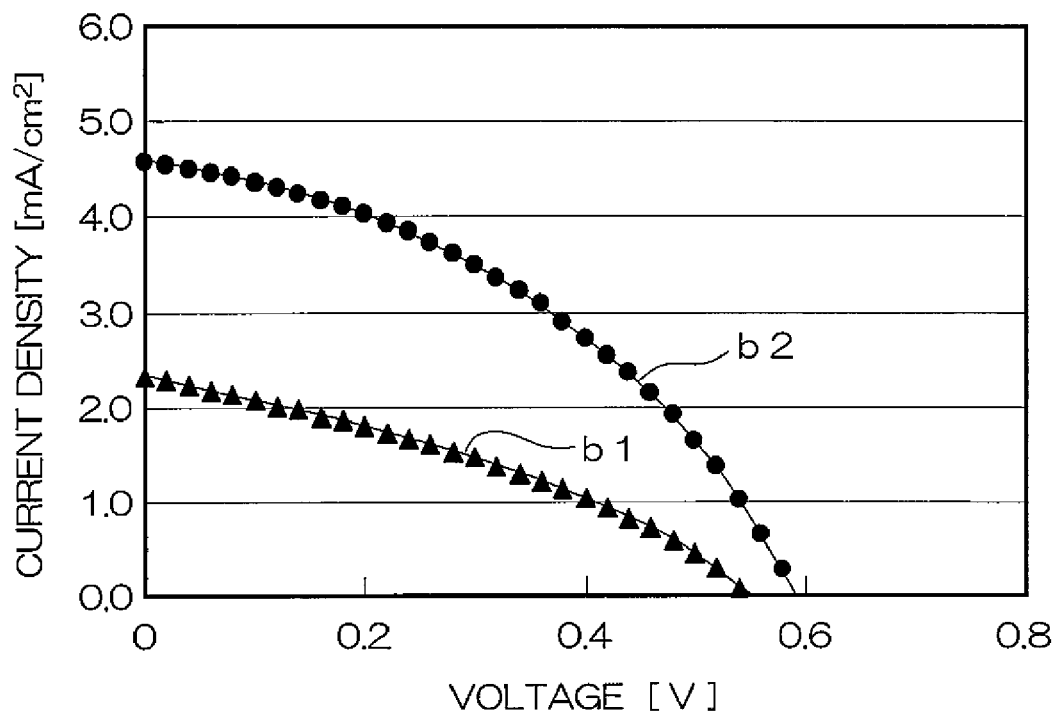
FIG. 11 is a view showing current versus voltage characteristics of a base exposed type composite in which the base is exposed through an array of needle-like crystals and a base covered type composite in which the base is substantially covered with an array of needle-like crystals.
Figure 12:
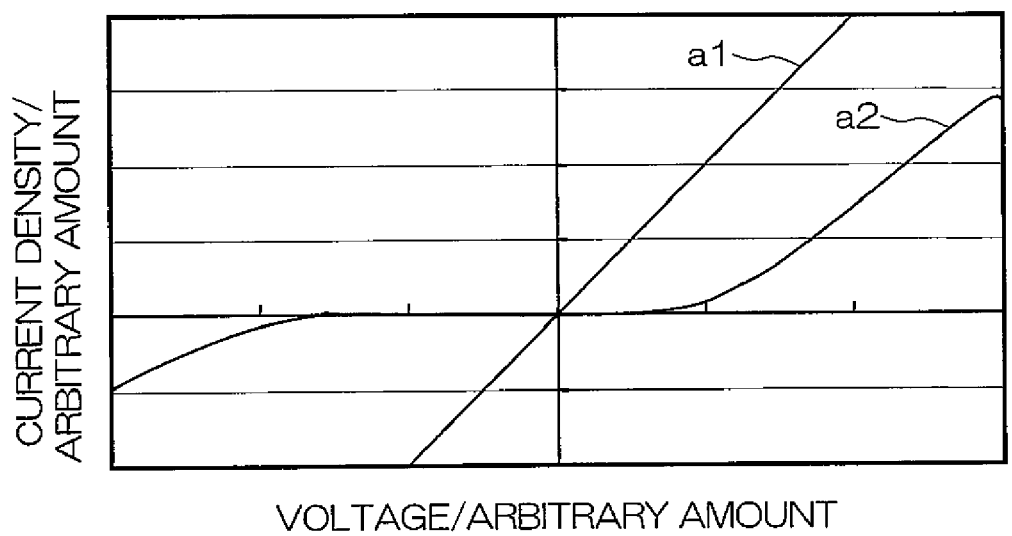
FIG. 12 is a view showing current versus voltage characteristics of dye sensitizing photovoltaic cells respectively using an array of zinc oxide needle-like crystals through which the base is exposed in part and an array of zinc oxide needle-like crystals substantially covering the base.
Figure 13A:
FIG. 13A is a view showing an EBSP when an array of zinc oxide needle-like crystals is observed from the first region side.
Figure 13B:
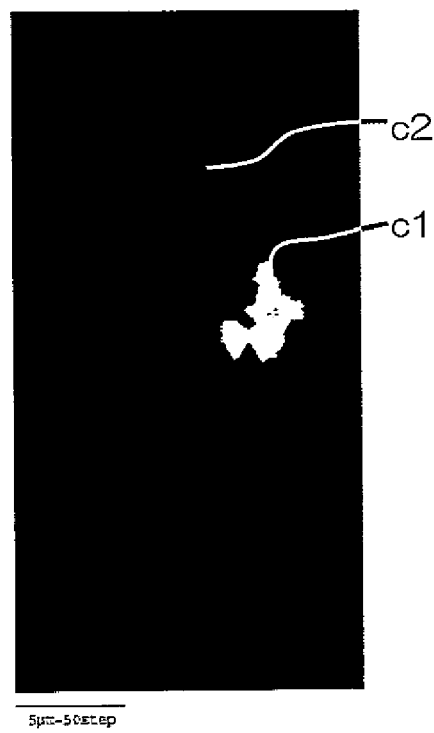
FIG. 13B is a view showing an EBSP when an array of zinc oxide needle-like crystals is observed from the second region side.
Figure 14A:
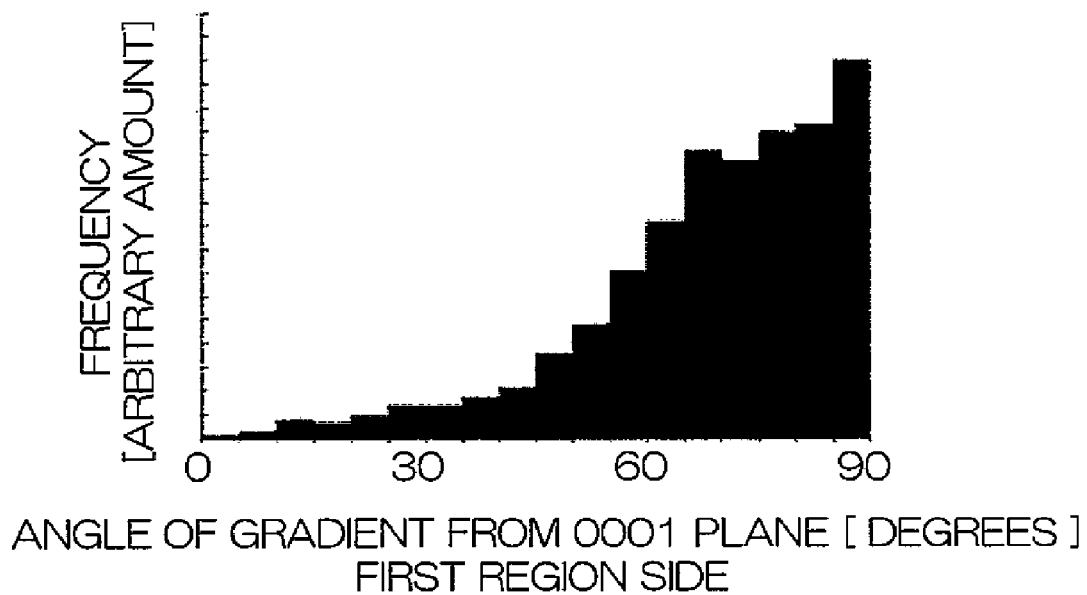
FIG. 14A is a frequency distribution of plane orientations of zinc oxide needle-like crystals on the first region side.
Figure 14B:
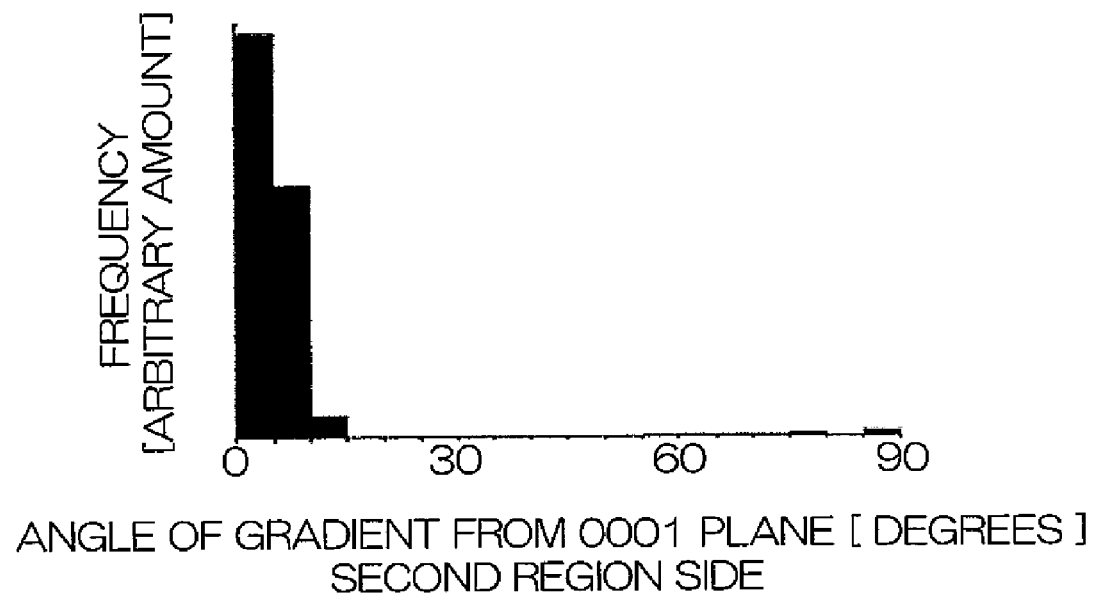
FIG. 14B is a frequency distribution of plane orientations of zinc oxide needle-like crystals on the second region side.
Figure 15:
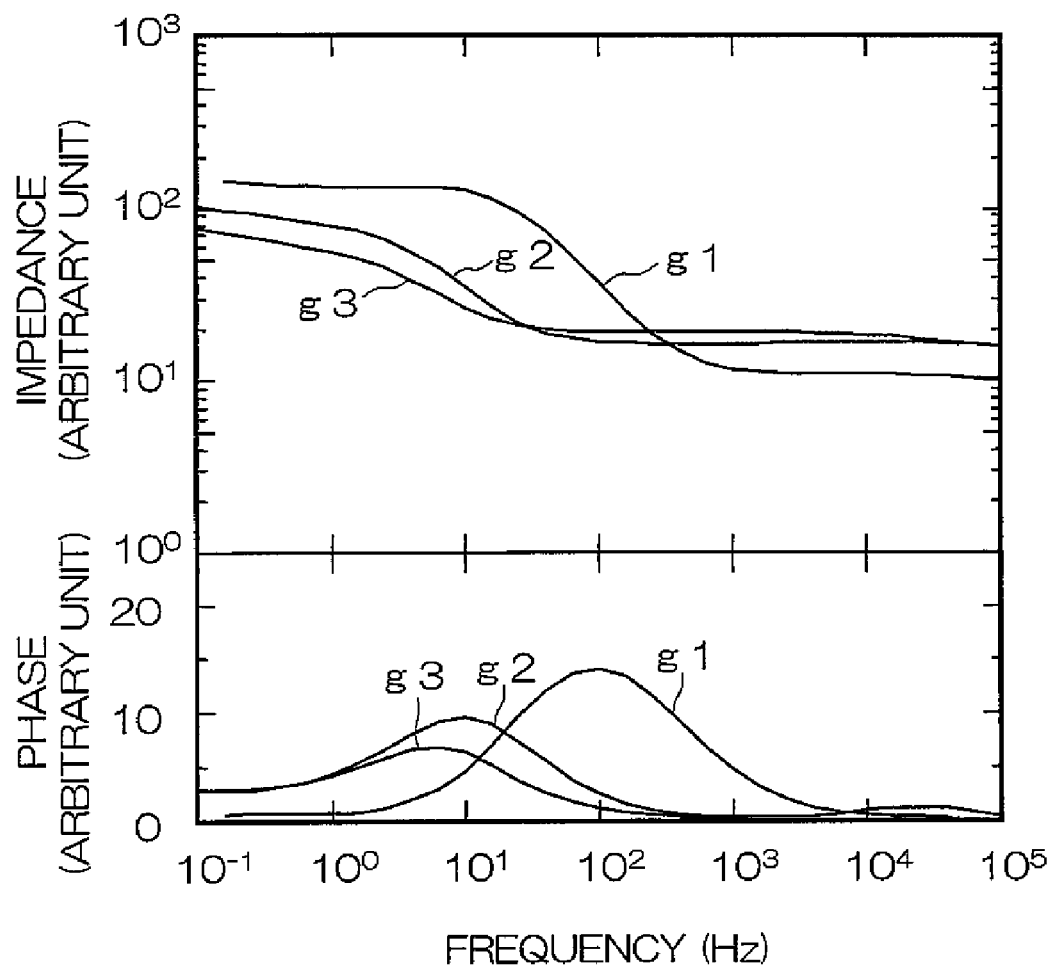
FIG. 15 is a Bode diagram obtained by measuring impedance of an array of needle-like crystals, a thin film made of non-oriented zinc oxide needle-like crystals, and a thin film made of particles of zinc oxide.

DESCRIPTION OF REFERENCE CHARACTERS 1, 1A, and 11: photovoltaic conversion element
2: transparent electrode
3, 23, and 33: needle-like crystals
3A, 23A, and 33A: first needle-like crystals
3B, 23B, and 33B: second needle-like crystals
3C: third needle-like crystals (external needle-like crystals)
4, 24, and 34: array
5: p-type semiconductor portion
7 and 27: microscopic region
10, 20, 30, and 40: composite
21 and 31: capacitor
22: storage node
25: protective film
32: substrate
35: electrolytic solution
123: plating solution
124: base
R1 and R21: first region
R2 and R22: second region
S: staring point

What is claimed is:

1. A composite comprising a base and an array of a plurality of needle-like crystals made of oxide and formed on a surface of the base, each needle-like crystal of the plurality comprising an aspect ratio of at least 5; and
wherein the array includes a first region on a side of the base and a second region on an opposite side to the base with respect to the first region; and
wherein a proportion of a cross section of the needle-like crystals in a plane parallel to the surface of the base is lower in the second region than in the first region and the surface of the base is substantially covered with the needle-like crystals in the first region.

2. A composite comprising a base and an array of a plurality of needle-like crystals made of oxide and formed on a surface of the base, each needle-like crystal of the plurality comprising an aspect ratio of at least 5; and
wherein the array includes a first region on a side of the base and a second region on an opposite side to the base with respect to the first region; and
wherein an orientation degree of the needle-like crystals in the first region is low in comparison with the second region, and the surface of the base is substantially covered with the needle-like crystals in the first region.

3. The composite according to claim 2, wherein:
a proportion of a cross section of the needle-like crystals in a plane parallel to the surface of the base is lower in the second region than in the first region.

4. A composite comprising a base and an array of a plurality of needle-like crystals made of oxide and formed on a surface of the base, each needle-like crystal of the plurality comprising an aspect ratio of at least 5; and
wherein the plurality of needle-like crystals include first needle-like crystals extending from respective plural starting points positioned spaced apart from one another on the surface of the base in a direction producing an angle with the surface of the base such that falls within a specific angular range, and second needle-like crystals extending from respective plural starting points in a direction within a wider angular range encompassing the specific angular range and shorter than the first needle-like crystals; and
wherein a portion on the surface of the base exposed through the first needle-like crystals is substantially covered with the second needle-like crystals.

5. The composite according to claim 1, wherein:
the needle-like crystals include first needle-like crystals extending from respective plural starting points positioned spaced apart from one another on the surface of the base in a direction producing an angle with the surface of the base such that falls within a specific angular range, and second needle-like crystals extending from the respective starting points in a direction within a wider angular range encompassing the specific angular range and shorter than the first needle-like crystals; and
a portion on the surface of the base exposed through the first needle-like crystals is substantially covered with the second needle-like crystals.

6. The composite according to claim 1, wherein:
a longitudinal direction and a direction of a c-axis coincide with each other in the needle-like crystals and the longitudinal direction of the needle-like crystals is oriented in a specific direction.

7. The composite according to claim 1, her containing:
a plurality of external needle-like crystals extending from end portions of the needle-like crystals on an opposite side to the base to an outside of an array region of the needle-like crystals.

8. The composite according to claim 7, wherein:
the plurality of external needle-like crystals extend in random directions within an angular range within which no interference with the array occurs.

9. The composite according to claim 1, wherein:
the needle-like crystals are made of zinc oxide.

10. The composite according to claim 1, wherein:
a plurality of microscopic regions having random crystal orientations are present in a vicinity of an interface between the array and the base.

11. A photovoltaic conversion element comprising:
the composite set forth in claim 1,
wherein:
the array in the composite is of one conduction type; and
the photovoltaic conversion element further comprises a semiconductor portion of an opposite conduction type opposing a surface of the needle-like crystals.

12. A light emitting element comprising:
the composite set forth in claim 1, wherein:
the array in the composite is of one conduction type; and
the light emitting element further comprises a semiconductor portion of an opposite conduction type opposing a surface of the needle-like crystals.

13. A capacitor comprising:
the composite set forth in claim 1,
wherein:
the array in the composite functions as a first electrode; and
the capacitor further comprises a second electrode opposing the first electrode and a dielectric material interposed between the first electrode and the second electrode.

14. A capacitor comprising:
the composite set forth in claim 1, wherein:
the array in the composite functions as a first polarizable electrode; and
the capacitor further comprises a second polarizable electrode opposing the first polarizable electrode and an electrolytic solution interposed between the first polarizable electrode and the second polarizable electrode.

15. A method for producing the composite set forth in claim 1 comprising:
a step of forming the needle-like crystals on a foundation made of a plurality of crystal grains that are crystal grains having random crystal orientations by means of electroless plating using a plating solution containing at least one kind of alkali selected from the group consisting of $X^1OH$, where $X^1$ is one of Na, K, and Cs, $X^2{}_2CO_3$, where $X^2$ is one of H, Na, K, and Cs, and $NH_3$ and having a pH of 13 or higher.

16. A method for producing the composite set forth in claim 1 comprising:
a step of forming the needle-like crystals on a foundation having a hydrophilic surface and being amorphous by means of electroless plating using a plating solution containing at least one kind of alkali selected from the group consisting of $X^1OH$, where $X^1$ is one of Na, K, and Cs, $X^2{}_2CO_3$, where $X^2$ is one of H, Na, K, and Cs, and $NH_3$ and having a pH of 13 or higher.

17. The method for producing the composite according to claim 15, wherein:
the foundation contains a surface portion of the base.

18. The method for producing the composite according to claim 15, further comprising:
a step of placing particles on the surface of the base,
wherein the foundation contains the particles placed on the base.

19. A method for producing a composite comprising a base and an array of a plurality of needle-like crystals made of oxide and formed on a surface of the base:
wherein the array includes a first region on a side of the base and a second region on an opposite side to the base with respect to the first region; and
wherein a proportion of a cross section of the needle-like crystals in a plane parallel to the surface of the base is lower in the second region than in the first region and the surface of the base is substantially covered with the needle-like crystals in the first region; and
wherein a plurality of microscopic regions having random crystal orientations are present in a vicinity of an interface between the array and the base according to claim 18, wherein:
the particles are made of a same material as the microscopic regions.

20. The method for producing the composite according to claim 18, wherein:
the step of placing the particles includes a step of forming a thin film made of the particles to have an average thickness of 50 nm or smaller on the base.

21. The method for producing the composite according to claim 18, wherein:
the step of placing the particles includes a step of forming a thin film made of the particles to have an average thickness of 20 nm or smaller on the base.

22. The method for producing the composite according to claim 18, wherein the step of placing the particles includes:
a step of placing a precursor of a substance forming the particles on the base; and
a step of forming the particles by decomposing the precursor.

\* \* \* \* \*